US012785248B2

(12) United States Patent
Park et al.

(10) Patent No.: US 12,785,248 B2
(45) Date of Patent: Nov. 3, 2026

(54) ANTENNA HAVING SINGLE NON-CONDUCTIVE PORTION AND ELECTRONIC DEVICE INCLUDING THE SAME

(71) Applicant: Samsung Electronics Co., Ltd., Suwon-si (KR)

(72) Inventors: Sungkoo Park, Suwon-si (KR); Hyungjoo Lee, Suwon-si (KR); Shinho Yoon, Suwon-si (KR); Himchan Yun, Suwon-si (KR); Soonho Hwang, Suwon-si (KR); Jaebong Chun, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/893,130

(22) Filed: Sep. 23, 2024

(65) Prior Publication Data

US 2025/0015482 A1 Jan. 9, 2025

Related U.S. Application Data

(60) Continuation of application No. 18/161,394, filed on Jan. 30, 2023, now Pat. No. 12,100,884, which is a (Continued)

(30) Foreign Application Priority Data

Oct. 16, 2018 (KR) ........................ 10-2018-0122922

(51) Int. Cl.
*H01Q 1/24* (2006.01)
*G06F 1/16* (2006.01)
(Continued)

(52) U.S. Cl.
CPC ......... *H01Q 1/2266* (2013.01); *G06F 1/1616* (2013.01); *G06F 1/1626* (2013.01);
(Continued)

(58) Field of Classification Search
CPC ........ H01Q 1/2266; H01Q 1/38; H01Q 5/328; H01Q 5/335; H01Q 5/35; H01Q 9/30;
(Continued)

(56) References Cited

U.S. PATENT DOCUMENTS 9,541,962 B2 1/2017 Siddiqui
9,698,857 B1 7/2017 Lee et al.
(Continued)

FOREIGN PATENT DOCUMENTS

CN 106169641 A 11/2016
CN 106450662 A 2/2017
(Continued)

OTHER PUBLICATIONS

Korean Notice of Allowance dated Sep. 23, 2024, issued in Korean Patent Application No. 10-2023-0090916.
(Continued)

*Primary Examiner* — David E Lotter
(74) *Attorney, Agent, or Firm* — Jefferson IP Law, LLP

(57) ABSTRACT

An electronic device is provided. The electronic device includes a foldable housing including, a hinge structure, a first housing structure including a first surface, a second surface, and a first side member, wherein the first side member encloses at least a portion of a space between the first surface and the second surface and includes a first conductive portion, a first non-conductive portion, and a second conductive portion, and a second housing structure including a third surface, a fourth surface, and a second side member, a printed circuit board, at least one wireless communication circuit including a first electrical path and a
(Continued)

second electrical path, a first variable element including a first terminal, a second terminal, and a third terminal, and a second variable element including a fourth terminal, a fifth terminal, and a sixth terminal.

12 Claims, 17 Drawing Sheets

Related U.S. Application Data continuation of application No. 17/394,909, filed on Aug. 5, 2021, now Pat. No. 11,569,561, which is a division of application No. 16/596,108, filed on Oct. 8, 2019, now Pat. No. 11,114,744.

(51) Int. Cl.
*H01Q 1/22* (2006.01)
*H01Q 1/38* (2006.01)
*H05K 1/181* (2026.01)

(52) U.S. Cl.
CPC ............... *H01Q 1/38* (2013.01); *H05K 1/181* (2013.01); *H05K 2201/1031* (2013.01)

(58) Field of Classification Search
CPC ............ H01Q 9/42; H01Q 1/243; H01Q 1/22; H01Q 1/48; H01Q 1/50; H01Q 5/20; H01Q 5/307; G06F 1/1616; G06F 1/1626; H05K 1/181; H05K 2201/1031; H05K 5/0217; H05K 7/14; H04M 1/0216; H04M 1/0249; H04M 1/0269; H04M 1/0277; H04B 1/40
See application file for complete search history.

(56) References Cited

U.S. PATENT DOCUMENTS

| | | | | |
|---|---|---|---|---|
| 9,813,532 | B2 | 11/2017 | Kim et al. | |
| 2013/0194136 | A1* | 8/2013 | Handro | H01Q 5/378 29/601 |
| 2014/0240178 | A1 | 8/2014 | Chun et al. | |
| 2016/0344439 | A1 | 11/2016 | Seol et al. | |
| 2017/0047637 | A1 | 2/2017 | Kim et al. | |
| 2017/0047638 | A1 | 2/2017 | Kim et al. | |
| 2017/0047639 | A1* | 2/2017 | Lee | H01Q 1/48 |
| 2017/0047641 | A1 | 2/2017 | Kim et al. | |
| 2017/0048366 | A1 | 2/2017 | Jeong | |
| 2017/0142241 | A1 | 5/2017 | Kim et al. | |
| 2017/0244818 | A1 | 8/2017 | Kim et al. | |
| 2017/0346164 | A1 | 11/2017 | Kim et al. | |
| 2017/0374182 | A1 | 12/2017 | Lee et al. | |
| 2018/0026361 | A1 | 1/2018 | Sakong et al. | |
| 2018/0034135 | A1 | 2/2018 | Kwak et al. | |
| 2018/0048359 | A1 | 2/2018 | Kim et al. | |
| 2018/0069298 | A1 | 3/2018 | Woo | |
| 2018/0069301 | A1 | 3/2018 | Choi et al. | |
| 2018/0076507 | A1 | 3/2018 | Heo | |
| 2018/0131077 | A1 | 5/2018 | Kang et al. | |
| 2018/0277929 | A1* | 9/2018 | Seo | H01Q 1/241 |
| 2019/0252766 | A1 | 8/2019 | Jeon et al. | |
| 2019/0341688 | A1 | 11/2019 | Kim et al. | |

FOREIGN PATENT DOCUMENTS

| | | | |
|---|---|---|---|
| CN | 106711579 | A | 5/2017 |
| CN | 107403996 | A | 11/2017 |
| CN | 107799885 | A | 3/2018 |
| CN | 108352601 | A | 7/2018 |
| CN | 108432043 | A | 8/2018 |
| CN | 108631039 | A | 10/2018 |
| EP | 3 293 816 | A1 | 3/2018 |
| KR | 10-2017-0018682 | A | 2/2017 |
| KR | 10-2017-0019838 | A | 2/2017 |
| KR | 10-2017-0020013 | A1 | 2/2017 |
| KR | 10-2017-0056292 | A | 5/2017 |
| KR | 10-2017-0073964 | A | 6/2017 |
| KR | 10-2017-0136292 | A | 12/2017 |
| KR | 10-2018-0027881 | A | 3/2018 |
| KR | 10-2018-0029326 | A | 3/2018 |
| KR | 10-2018-0108256 | A | 10/2018 |

OTHER PUBLICATIONS

International Search Report dated Jan. 22, 2020, issued in International Application No. PCT/KR2019/013163.
Extended European Search Report dated Mar. 18, 2020, issued in European Application No. 19202104.6.
Korean Office Action dated Oct. 5, 2022, issued in Korean Patent Application No. 10-2018-0122922.
Indian Office Actions dated Dec. 22, 2022, issued in Indian Patent Application No. 202117013091.
European Office Actions dated Jan. 3, 2023, issued in European Patent Application No. 19202104.6.
Korean Notice of Allowance dated Apr. 18, 2023, issued in Korean Patent Application No. 10-2018-0122922.
Chinese Office Action dated Aug. 3, 2023, issued in Chinese Patent Application No. 201980065893.9.
Korean Office Action dated Jan. 18, 2024, issued in Korean Patent Application No. 10-2023-0090916.
Chinese Office Action dated Feb. 28, 2024, issued in Chinese Patent Application No. 201980065893.9.
Indian Hearing Notice dated May 22, 2024, issued in Indian Patent Application No. 202117013091.
Chinese Notice of Allowance dated May 13, 2024, issued in Chinese Patent Application No. 201980065893.9.
Extended European Search Report dated Nov. 20, 2025, issued in European Patent Application No. 25197676.7.

* cited by examiner

ANTENNA HAVING SINGLE NON-CONDUCTIVE PORTION AND ELECTRONIC DEVICE INCLUDING THE SAME

CROSS-REFERENCE TO RELATED APPLICATION(S)

This application a continuation application of prior application Ser. No. 18/161,394, filed on Jan. 30, 2023, which is a continuation application of prior application Ser. No. 17/394,909, filed on Aug. 5, 2021, which has issued as U.S. Pat. No. 11,569,561 on Jan. 31, 2023, which is a divisional application of prior application Ser. No. 16/596,108, filed on Oct. 8, 2019, which has issued as U.S. Pat. No. 11,114,744 on Sep. 7, 2021 and is based on and claims priority under 35 U.S.C. § 119(a) of a Korean patent application number 10-2018-0122922, filed on Oct. 16, 2018, in the Korean Intellectual Property Office, the disclosure of which is incorporated by reference herein in its entirety.

BACKGROUND

1. Field

The disclosure relates to an antenna using a single non-conductive portion and an electronic device including the antenna.

2. Description of the Related Art

Advances in electronics and communication technologies have enabled development of electronic devices having various functions and shapes. Such electronic devices are convergence devices that can perform one or more functions in combination.

As the functional gap between manufacturers has narrowed significantly in recent years, to satisfy consumer needs, electronic devices are becoming slimmer, while conductive members (e.g., metal frames or metal bezels) are used to increase their rigidity. In the case of an electronic device for communication, at least a portion of the conductive member may be used as the antenna for slimming, which requires improvement in radiation performance.

When the exterior of an electronic device is made of a conductive member (e.g., metal frame or metal bezel) to meet the slimming trend of electronic devices, unlike an injection molded dielectric material, the antenna is not separately designed but at least a portion of the conductive member may be used as the antenna. For example, when a conductive member serving as the side member of the electronic device is used as an antenna, the segment between conductive members may be filled with a non-conductive dielectric material and may be used as an insulation part for electrically disconnecting a specific location of the conductive member. Hence, the electrical length of the antenna from the feeder can be adjusted, enabling the antenna to operate in a specified frequency band.

The antenna may be utilized as a radiator by feeding a unit conductive portion of the conductive member electrically insulated by a pair of non-conductive portions spaced at a given interval. For example, it is preferable to design the antenna so as to cover various low bands required by the operator. However, the unit conductive portion segmented by the pair of non-conductive portions has a limited physical length due to the slimming of the electronic device, and cannot cover various low bands even when a matching circuit or an additional radiator is used. In addition, even when the frequency is shifted in the low band by using a matching circuit or an additional radiator, the performance may be degraded as the frequency shifts to a lower frequency owing to the limitation of the physical length of the conductive portion.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an antenna using a single non-conductive portion and an electronic device including the same.

Another aspect of the disclosure is to provide an antenna using a single non-conductive portion and an electronic device including the same that can produce a specified radiation performance when shifted in a low band.

Additional aspects will be set forth in part in the description which follows and, in part, will be apparent from the description, or may be learned by practice of the presented embodiments.

In accordance with an aspect of the disclosure, an electronic device is provided. The electronic device includes a foldable housing including, a hinge structure, a first housing structure connected to the hinge structure and including a first surface facing in a first direction, a second surface facing in a second direction opposite to the first direction, and a first side member, wherein the first side member encloses at least a portion of a space between the first surface and the second surface and includes a first conductive portion, a first non-conductive portion, and a second conductive portion arranged in sequence from the hinge structure, and a second housing structure connected to the hinge structure and foldable with the first housing structure with respect to the hinge structure, and including a third surface facing in a third direction, a fourth surface facing in a fourth direction opposite to the third direction, and a second side member, wherein the second side member encloses at least a portion of a space between the third surface and the fourth surface and includes a third conductive portion, a second non-conductive portion, a fourth conductive portion, a third non-conductive portion, and a fifth conductive portion arranged in sequence from the hinge structure, wherein the first surface faces the third surface in a folded state and the third direction is the same as the first direction in an unfolded state, a flexible display extending from the first surface to the third surface, a printed circuit board disposed between the first surface and the second surface and including at least one ground layer, at least one wireless communication circuit disposed in the printed circuit board and including a first electrical path carrying a first signal of a first frequency band and a second electrical path carrying a second signal of a second frequency band, a first variable element including a first terminal electrically connected to the first electrical path, a second terminal electrically connected to the ground layer, and a third terminal electrically connected to a first position of the second conductive portion, and a second variable element including a fourth terminal electrically connected to the second electrical path, a fifth terminal electrically connected to the ground layer, and a sixth terminal electrically connected to a third electrical path connected to a second position of the second conductive portion, the second position being closer to the first non-conductive portion than the first position.

In accordance with another aspect of the disclosure, an electronic device is provided. The electronic device includes a housing including a first plate, a second plate facing away from the first plate, and a side member enclosing a space between the first plate and the second plate and connected to the second plate or formed as a single body with the second plate, wherein the side member includes a first conductive portion, a second conductive portion, and a non-conductive portion formed between the first conductive portion and the second conductive portion, wherein the first conductive portion includes a first position and a second position closer to the non-conductive portion than the first position, a printed circuit board disposed between the first plate and the second plate and including at least one ground layer, at least one wireless communication circuit disposed in the printed circuit board and including a first electrical path carrying a first signal of a first frequency band and a second electrical path carrying a second signal of a second frequency band, a first variable element including a first terminal electrically connected to the first electrical path, a second terminal electrically connected to the ground layer, and a third terminal electrically connected to the first position, and a second variable element including a fourth terminal electrically connected to the second electrical path, a fifth terminal electrically connected to the ground layer, and a sixth terminal electrically connected to a third electrical path connected to the second position.

In accordance with another aspect of the disclosure, an electronic device is provided. The electronic device includes a housing including a first plate, a second plate facing away from the first plate, and a side member enclosing a space between the first plate and the second plate, wherein the side member includes a first conductive portion, a second conductive portion, and a non-conductive portion formed between the first conductive portion and the second conductive portion, wherein the first conductive portion includes a first position and a second position closer to the non-conductive portion than the first position, a printed circuit board disposed between the first plate and the second plate and including at least one ground layer, at least one wireless communication circuit disposed in the printed circuit board and including a first electrical path electrically connected to the first conductive portion at the first position and carrying a first signal of a first frequency band, and a second electrical path electrically connected to the first conductive portion at the second position and carrying a second signal of a second frequency band, a first variable element included in the middle of the first electrical path, a second variable element included in the middle of the second electrical path, and at least one processor configured to generate a control signal corresponding to the current mode of the electronic device and apply the control signal to at least one of the first variable element or the second variable element.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding, but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but are merely used by the inventor to enable a clear and consistent understanding of the disclosure. Accordingly, it should be apparent to those skilled in the art that the following description of various embodiments of the disclosure is provided for illustration purposes only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
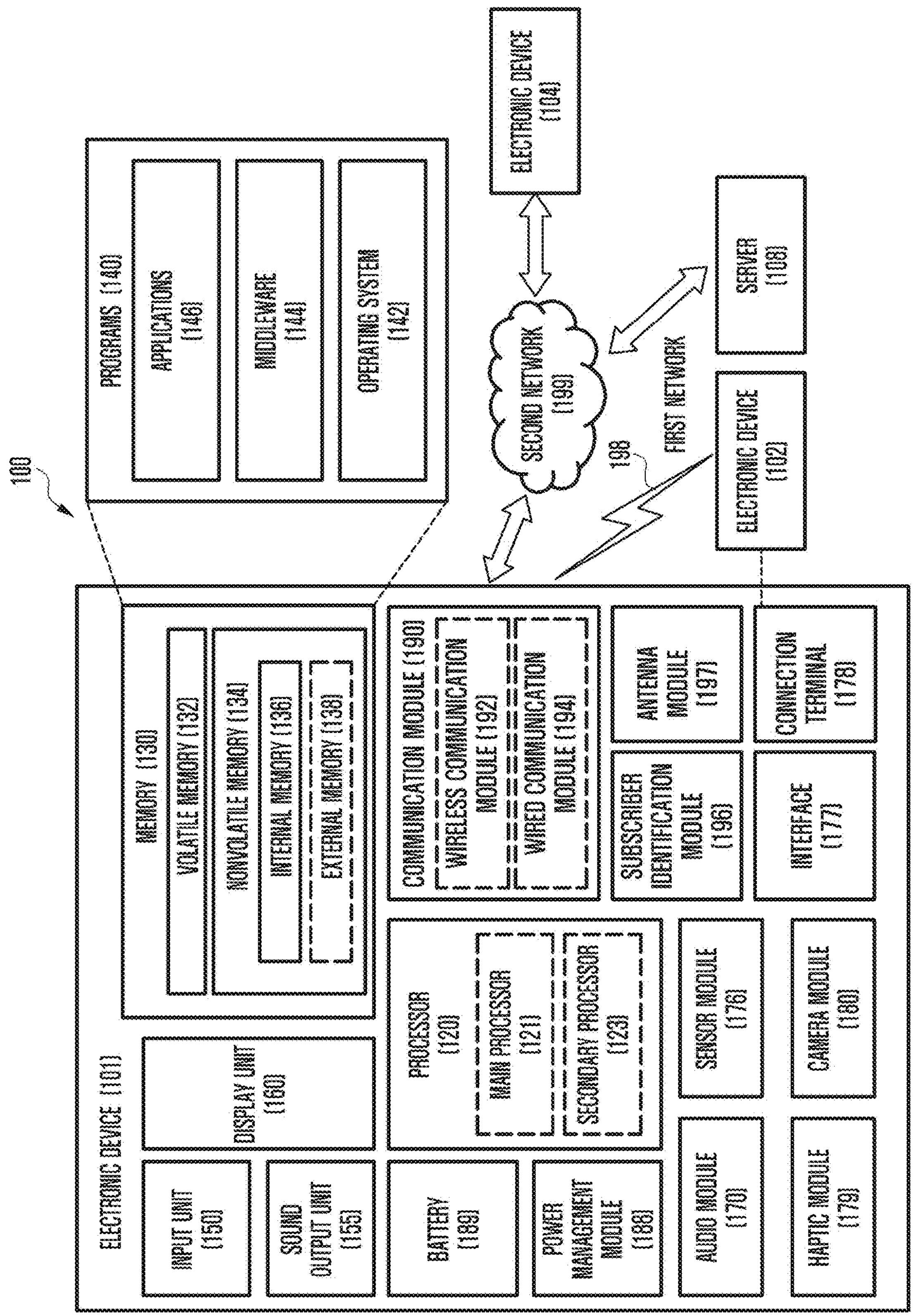
FIG. 1 is a block diagram of an electronic device in a network environment according to an embodiment of the disclosure.

FIG. 1 is a block diagram of an electronic device in a network environment according to an embodiment of the disclosure.

Referring to FIG. 1, in the network environment 100, the electronic device 101 may communicate with an electronic device 102 through a first network 198 (e.g., short-range wireless communication network) or may communicate with an electronic device 104 or a server 108 through a second network 199 (e.g., long-distance wireless communication network). In one embodiment, the electronic device 101 may communicate with the electronic device 104 through the server 108. According to an embodiment, the electronic device 101 may include a processor 120, a memory 130, an input unit 150, a sound output unit 155, a display unit 160, an audio module 170, a sensor module 176, an interface 177, a haptic module 179, a camera module 180, a power management module 188, a battery 189, a communication module 190, a subscriber identification module 196, and an antenna module 197. In one embodiment, at least one component (e.g., display unit 160 or camera module 180) among the components of the electronic device 101 may be omitted, or other components may be added to the electronic device 101. In one embodiment, some of these components may be implemented as an integrated circuit. For example, the sensor module 176 (e.g., fingerprint sensor, iris sensor, or illuminance sensor) may be embedded in the display unit 160 (e.g., display).

The processor 120 may execute, for example, software (e.g., program 140) to control at least one of other components (e.g., hardware component or software component) of the electronic device 101 connected to the processor 120, and may process a variety of data or perform various computations. In one embodiment, as part of data processing or computation, the processor 120 may load a command or data received from other components (e.g., sensor module 176 or communication module 190) into the volatile memory 132, process the command or data stored in the volatile memory 132, and store the result data in the non-volatile memory 134. In one embodiment, the processor 120 may include a main processor 121 (e.g., central processing unit, or application processor), and a secondary processor 123 (e.g., graphics processing unit, image signal processor, sensor hub processor, or communication processor), which may operate independently of or in cooperation with the main processor 121. Additionally or alternatively, the secondary processor 123 may consume less power or may be more specialized in a specific function compared with the main processor 121. The secondary processor 123 may be implemented separately from or as part of the main processor 121.

The secondary processor 123 may control at least some of the functions or states associated with at least one component (e.g., display unit 160, sensor module 176, or communication module 190) among the components of the electronic device 101, for example, instead of the main processor 121 while the main processor 121 is in an inactive (e.g., sleep) state, or together with the main processor 121 while the main processor 121 is in an active (e.g., application execution) state. In one embodiment, the secondary processor 123 (e.g., image signal processor or communication processor) may be implemented as a part of another component (e.g., camera module 180 or communication module 190) that is functionally related to the secondary processor 123.

The memory 130 may store a variety of data used by at least one component (e.g., processor 120 or sensor module 176) of the electronic device 101. The data may include, for example, software (e.g., program 140) and input data or output data for commands associated with the software. The memory 130 may include a volatile memory 132 or a nonvolatile memory 134.

The programs 140 may be stored in the memory 130 as software, and may include, for example, an operating system 142, a middleware 144, or an application 146.

The input unit 150 may receive a command or data, which can be to be used for a component (e.g., processor 120) of the electronic device 101, from the outside of the electronic device 101 (e.g., user). The input unit 150 may include, for example, a microphone, a mouse, a keyboard, or a digital pen (e.g., stylus pen).

The sound output unit 155 may output a sound signal to the outside of the electronic device 101. The sound output unit 155 may include, for example, a speaker and a receiver. The speaker may be used for general purposes, such as playback of multimedia or recordings, and the receiver may be used for receiving an incoming call. In one embodiment, the receiver may be implemented separately from or as part of the speaker.

The display unit 160 may visually present information to the outside of the electronic device 101 (e.g., user). The display unit 160 may include, for example, a display, a hologram device, or a projector, and a control circuit for controlling these. In one embodiment, the display unit 160 may include a touch circuitry configured to sense a touch, or a sensing circuitry (e.g., pressure sensor) configured to measure the strength of a force caused by a touch action.

The audio module 170 may convert a sound into an electric signal or convert an electric signal into a sound. In one embodiment, the audio module 170 may obtain a sound signal through the input unit 150 or may output a sound signal through an external electronic device (e.g., electronic device 102 (e.g., speaker or headphone)) wiredly or wirelessly connected to the sound output unit 155 or the electronic device 101.

The sensor module 176 may generate an electrical signal or a data value corresponding to the operating state (e.g., power or temperature) of the electronic device 101 or the environmental state (e.g., user state) outside the electronic device 101. The sensor module 176 may include, for example, a gesture sensor, a gyro sensor, a barometric pressure sensor, a magnetic sensor, an acceleration sensor, a grip sensor, a proximity sensor, a color sensor, an infrared sensor, a biometric sensor, a temperature sensor, a humidity sensor, or an illuminance sensor.

The interface 177 may support one or more designated protocols that enable the electronic device 101 to directly or wirelessly connect to an external electronic device (e.g., electronic device 102). In one embodiment, the interface 177 may include, for example, a high-definition multimedia interface (HDMI), a universal serial bus (USB) interface, an SD card interface, or an audio interface.

The connection terminal 178 may include a connector through which the electronic device 101 can be physically connected to an external electronic device (e.g., electronic device 102). In one embodiment, the connection terminal 178 may include, for example, an HDMI connector, a USB connector, a secure digital (SD) card connector, or an audio connector (e.g., headphone connector).

The haptic module 179 may convert an electrical signal into a mechanical stimulus (e.g., vibration or motion) or an electrical stimulus that can be perceived by the user through tactile or kinesthetic senses. In one embodiment, the haptic module 179 may include, for example, a motor, a piezoelectric element, or an electric stimulator.

The camera module 180 may capture a still image or a moving image. In one embodiment, the camera module 180 may include at least one lens, an image sensor, an image signal processor, or a flash.

The power management module 188 may manage the power supplied to the electronic device 101. The power management module 188 may be implemented as part of a power management integrated circuit (PMIC).

The battery 189 may supply power to at least one component of the electronic device 101. In one embodiment, the battery 189 may include, for example, a non-rechargeable primary cell, a rechargeable secondary cell, or a fuel cell.

The communication module 190 may establish a wired or wireless communication channel between the electronic device 101 and the external electronic device (e.g., electronic device 102, electronic device 104, or server 108) and support communication through the established communication channel. The communication module 190 may include at least one communication processor that can operate separately from the processor 120 (e.g., application processor) to support wired or wireless communication. In one embodiment, the communication module 190 may include a wireless communication module 192 (e.g., cellular communication module, short-range wireless communication module, or global navigation satellite system (GNSS) communication module), or a wired communication module 194 (e.g., local area network (LAN) communication module, or power line communication module). The corresponding communication module may communicate with an external electronic device through the first network 198 (e.g., short-range communication network such as Bluetooth, Wi-Fi direct, or infrared data association (IrDA)) or through the second network 199 (e.g., long-distance communication network such as a cellular network, the Internet, or a computer network such as a LAN or WAN). The above various communication modules may be implemented as one component (e.g., single chip) or as separate components (e.g., multiple chips). The wireless communication module 192 may identify and authenticate the electronic device 101 in the communication network such as the first network 198 or the second network 199 by using subscriber information stored in the subscriber identification module 196.

The antenna module 197 may transmit or receive a signal or power to or from the outside (e.g., external electronic device). In one embodiment, the antenna module 197 may include one antenna having a radiator made of a conductor or conductive pattern formed on a substrate (e.g., PCB). In one embodiment, the antenna module 197 may include a plurality of antennas. In this case, at least one antenna suitable for the communication scheme used in the communication network such as the first network 198 or the second network 199 may be selected from the plurality of antennas by, for example, the communication module 190. The signal or power may be transmitted or received between the communication module 190 and the external electronic device through the selected at least one antenna. In one embodiment, in addition to the radiator, another component (e.g., RFIC) may be further formed as part of the antenna module 197.

At least some of the above components may be connected to each other via a communication scheme between peripherals (e.g., bus, general purpose input and output (GPIO), serial peripheral interface (SPI), or mobile industry processor interface (MIPI)), and may exchange signals (e.g., commands or data) with each other.

In one embodiment, commands or data may be exchanged between the electronic device 101 and the external electronic device 104 through the server 108 connected to the second network 199. The electronic devices 102 and 104 may be of the same type as or a different type from the electronic device 101. In one embodiment, all or some of the operations that can be performed by the electronic device 101 may be performed by one or more of the external electronic devices 102, 104 and 108. For example, to perform a certain function or service automatically or upon request, the electronic device 101 may, instead of or in addition to executing the function or service, request one or more external electronic devices to execute at least some of the function or service. Upon reception of the request, the external electronic devices may execute at least a portion of the requested function or service or an additional function or service related to the request, and return the execution results to the electronic device 101. The electronic device 101 may further process the received results if necessary and provide the processing results as a response to the requested function or service. To this end, technologies such as cloud computing, distributed computing, and client-server computing may be used.

The electronic device according to various embodiments disclosed herein can be one of various types of devices, such as portable communication devices (e.g., smartphones), computers, portable multimedia devices, portable medical instruments, cameras, wearable devices, and home appliances. However, the electronic device is not limited to the above-mentioned devices.

It should be understood that the various embodiments of the disclosure and the terminology used herein are not intended to limit the techniques described herein to specific embodiments but to include various modifications, equivalents, and/or alternatives thereof. In the drawings, the same or similar reference symbols are used to refer to the same or like parts. In the description, the singular forms "a", "an" and "the" are intended to include the plural forms as well, unless the context clearly indicates otherwise. In the description, the expression "A or B", "at least one of A and/or B", "A, B or C", or "at least one of A, B and/or C" may indicate all possible combinations of the listed items. The terms "first" and "second" may refer to various elements regardless of importance and/or order and are used to distinguish one element from another element without limitation. It will be understood that when an element (e.g., first element) is referred to as being (functionally or communicatively) "coupled with/to" or "connected with/to" another element (e.g., second element), it can be coupled or connected with/to the other element directly (wiredly), wirelessly, or via a third element.

In the description, the term "module" may refer to a certain unit that is implemented in hardware, software, firmware, or a combination thereof. The term "module" may be used interchangeably with the term "unit", "logic", "logical block", "component", or "circuit", for example. The module may be the minimum unit, or a part thereof, which performs one or more particular functions. For example, a module may be implemented in the form of an application-specific integrated circuit (ASIC).

Various embodiments of the disclosure may be implemented in software (e.g., programs 140) including instructions stored in a machine-readable storage medium (e.g., internal memory 136 or external memory 138) readable by a machine (e.g., electronic device 101). For example, the processor (e.g., processor 120) of the machine (e.g., electronic device 101) can fetch a stored instruction from a storage medium and execute the fetched instruction. When the instruction is executed by the processor, the machine may perform the function corresponding to the instruction. The instructions may include a code generated by a compiler and a code executable by an interpreter. The machine-readable storage medium may be provided in the form of a non-transitory storage medium. Here, "non-transitory" means that the storage medium does not include a signal and is tangible, but does not distinguish whether data is stored semi-permanently or temporarily in the storage medium.

The method according to various embodiments disclosed herein may be provided as a computer program product. A computer program product may be traded between a seller and a purchaser as a commodity. A computer program product may be distributed in the form of a machine-readable storage medium (e.g., compact disc read only memory (CD-ROM)) or be distributed online (e.g., download or upload) directly between two user devices (e.g. smartphones) through an application store (e.g., PlayStore™). For on-line distribution, at least a portion of the computer program product may be temporarily stored or temporarily created in a storage medium such as a memory of a manufacturer's server, an application store's server, or a relay server.

Each of the components (e.g., modules or programs) according to various embodiments described above may be composed of one or more elements. An existing component may be omitted, and a new component may be added. Alternatively or additionally, some of the components (e.g., modules or programs) may be combined into one entity while maintaining the same functionality. Operations supported by a module, program, or another component may be carried out in sequence, in parallel, by repetition, or heuristically. Some operations may be executed in a different order or may be omitted, and a new operation may be added.

Figure 2A:
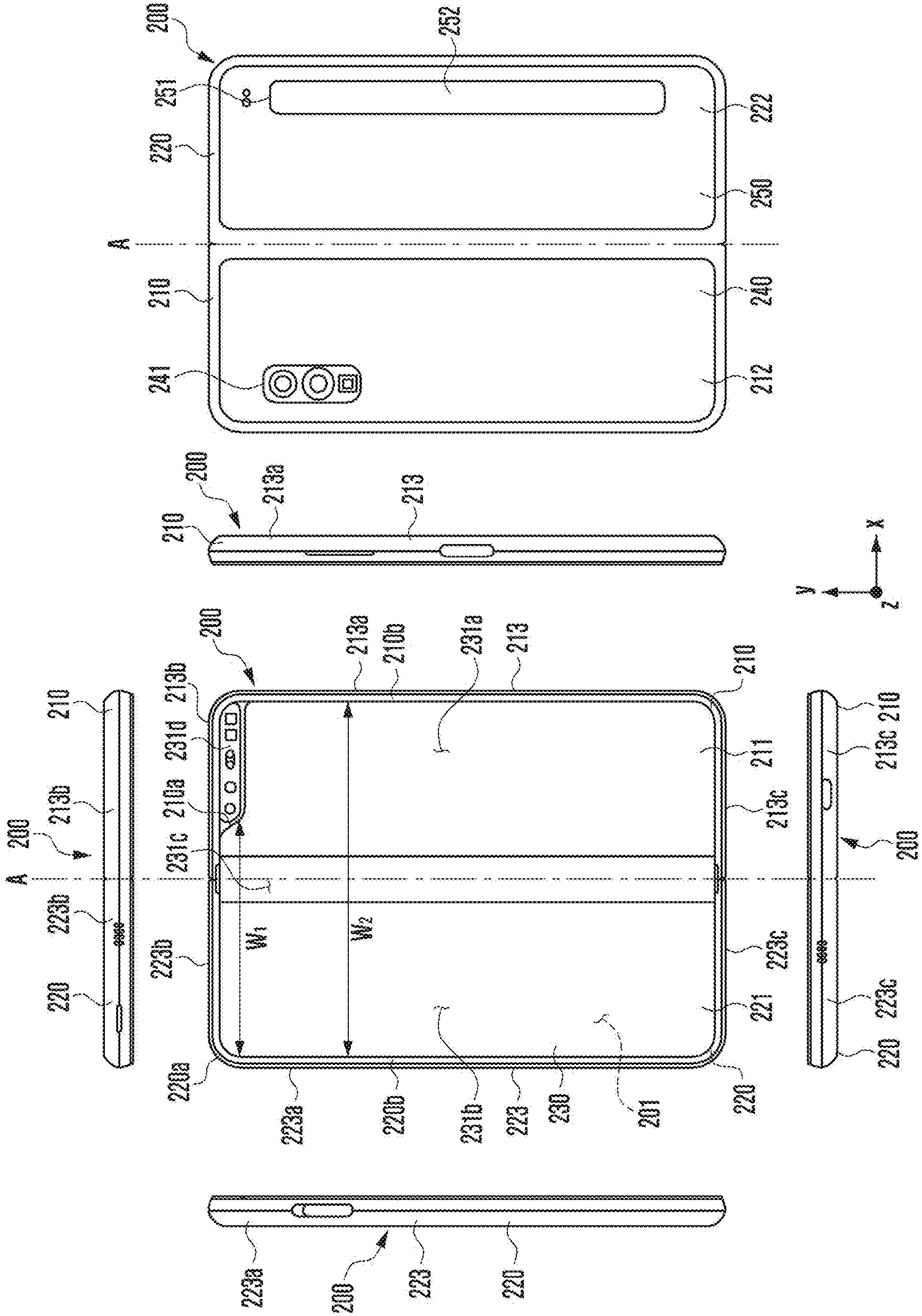
FIG. 2A is a view of the electronic device in the unfolded state according to an embodiment of the disclosure.

FIG. 2A is a view of an electronic device in the unfolded state according to an embodiment of the disclosure.

Figure 2B:
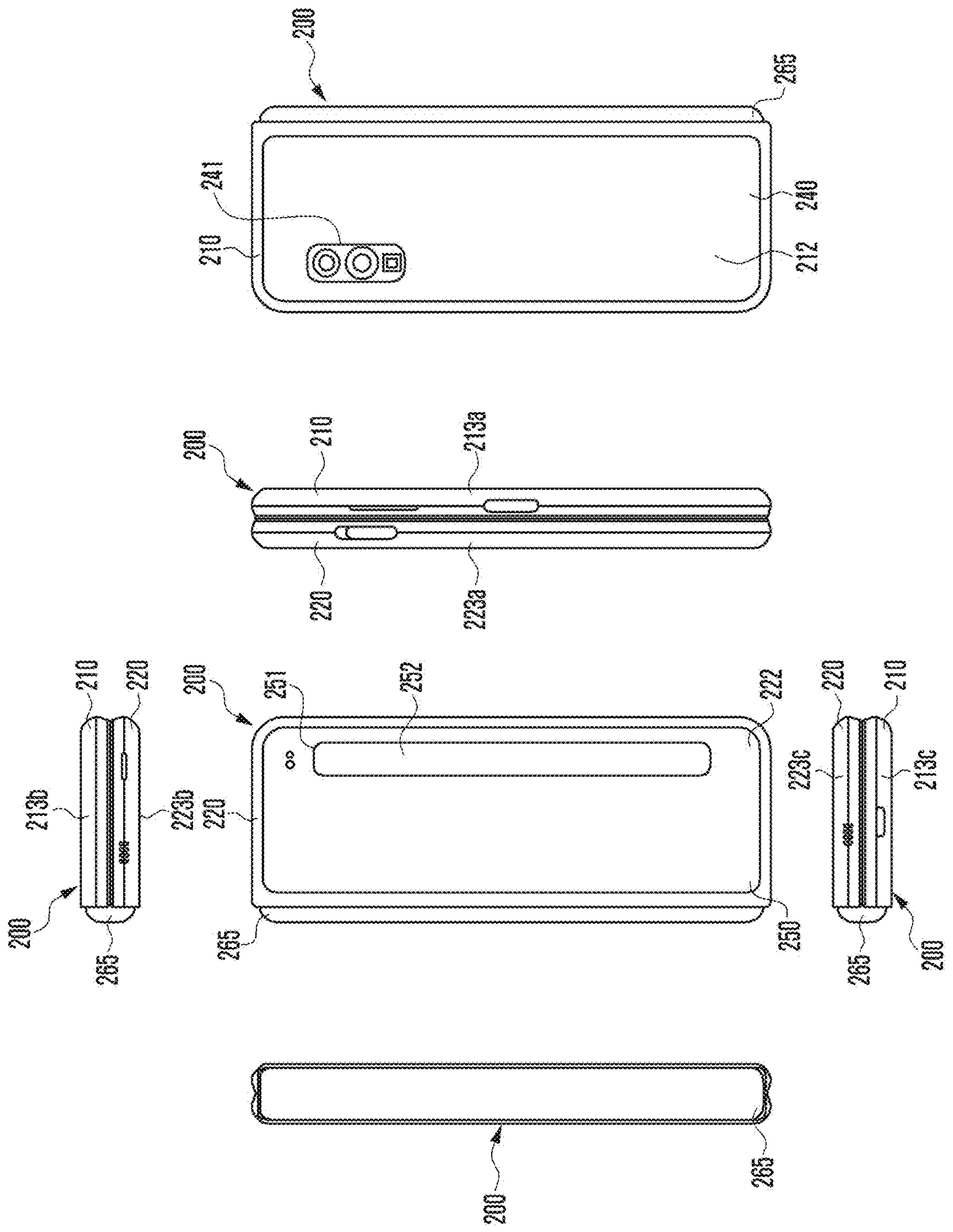
FIG. 2B is a view of the electronic device in the folded state according to an embodiment of the disclosure.

FIG. 2B is a view of an electronic device in the folded state according to embodiment of the disclosure.

Embodiments for the electronic device 200 of FIGS. 2A and 2B may be at least partially similar to or different from those for the electronic device 101 of FIG. 1.

Referring to FIG. 2A, the electronic device 200 may include a pair of housing structures 210 and 220 rotatably coupled via a hinge structure (e.g., hinge structure 264 in FIG. 3) to be folded relative to each other, a hinge cover 265 covering the foldable portion of the pair of housing structures 210 and 220, and a display 230 (e.g., flexible display or foldable display) disposed in the space formed by the pair of housing structures 210 and 220. The surface on which the display 230 is disposed may be referred to as the front surface of the electronic device 200, and the opposite side of the front surface may be referred to as the rear surface of the electronic device 200. The surface surrounding the space between the front surface and the rear surface may be referred to as the side surface of the electronic device 200.

In one embodiment, the pair of housing structures 210 and 220 may include a first housing structure 210 including a sensor region 231*d*, a second housing structure 220, a first rear cover 240, and a second rear cover 250. The pair of housing structures 210 and 220 of the electronic device 200 are not limited to the shape or combination shown in FIGS. 2A and 2B, but may be implemented in various shapes or combinations. For example, in another embodiment, the first housing structure 210 and the first rear cover 240 may be formed as a single body, and the second housing structure 220 and the second rear cover 250 may be formed as a single body.

In one embodiment, the first housing structure 210 and the second housing structure 220 may be disposed at both sides with respect to the folding axis (A axis) and may be substantially symmetrical with respect to the folding axis (A axis). In one embodiment, the angle or distance between the first housing structure 210 and the second housing structure 220 may vary depending upon whether the electronic device 200 is in the flat state or closed state, the folded state, or the intermediate state. In one embodiment, the first housing structure 210 includes the sensor region 231*d* where various sensors are disposed, but may have a symmetrical shape with the second housing structure 220 in other regions. In another embodiment, the sensor region 231*d* may be disposed in a specific region of the second housing structure 220 or may be replaced.

In one embodiment, during the flat state of the electronic device 200, the first housing structure 210 may be connected to the hinge structure (e.g., hinge structure 264 in FIG. 3), and may include a first surface 211 facing the front surface of the electronic device 200, a second surface 212 facing away from the first surface 211, and a first side member 213 enclosing at least a portion of the space between the first surface 211 and the second surface 212. In one embodiment, the first side member 213 may include a first side surface 213*a* disposed in parallel with the folding axis (A axis), a second side surface 213*b* extending from one end of the first side surface 213*a* in a direction perpendicular to the folding axis, and a third side surface 213*c* extending from the other end of the first side surface 213*a* in a direction perpendicular to the folding axis.

In one embodiment, during the flat state of the electronic device 200, the second housing structure 220 may be connected to the hinge structure (e.g., hinge structure 264 in FIG. 3), and may include a third surface 221 facing the front surface of the electronic device 200, a fourth surface 222 facing away from the third surface 221, and a second side member 223 enclosing at least a portion of the space between the third surface 221 and the fourth surface 222. In one embodiment, the second side member 223 may include a fourth side surface 223*a* disposed in parallel with the folding axis (A axis), a fifth side surface 223*b* extending from one end of the fourth side surface 223*a* in a direction perpendicular to the folding axis, and a sixth side surface 223*c* extending from the other end of the fourth side surface 223*a* in a direction perpendicular to the folding axis. In one embodiment, the third surface 221 may face the first surface 211 in the folded state.

In one embodiment, the electronic device 200 may include a recess 201 formed to accommodate the display 230 through a structural combination of the shapes of the first housing structure 210 and the second housing structure 220. The recess 201 may have substantially the same size as the display 230. In one embodiment, the recess 201 may have two or more different widths in a direction perpendicular to the folding axis (A axis) due to the sensor region 231*d*. For example, the recess 201 may have a first width (W1) between a first portion 220*a* of the second housing structure 220 parallel to the folding axis (A axis) and a first portion 210*a* of the first housing structure 210 formed at the edge of the sensor region 231*d*, and have a second width (W2) between a second portion 220*b* of the second housing structure 220 and a second portion 210*b* of the first housing structure 210 that does not correspond to the sensor region 213*d* and is parallel to the folding axis (A axis).

The second width (W2) may be wider than the first width (W1). The recess 201 may be formed to have the first width (W1) ranging from the first portion 210*a* of the first housing structure 210 to the first portion 220*a* of the second housing structure 220 (asymmetric shape), and the second width (W2) ranging from the second portion 210*b* of the first housing structure 210 to the second portion 220*b* of the second housing structure 220 (symmetric shape). In one embodiment, the first portion 210*a* and the second portion 210*b* of the first housing structure 210 may be located at different distances from the folding axis (A axis). The width of the recess 201 is not limited to the example shown above. In various embodiments, the recess 201 may have two or more different widths owing to the shape of the sensor region 213*d* or the asymmetry of the first housing structure 210 or the second housing structure 220.

In one embodiment, at least a portion of the first housing structure 210 and the second housing structure 220 may be made of a metal or non-metal material having a rigidity value selected to support the display 230.

In one embodiment, the sensor region 231*d* may be formed to have a preset area near to one corner of the first housing structure 210. However, the arrangement, shape, or size of the sensor region 231*d* is not limited to the illustrated example. For example, in a certain embodiment, the sensor region 231*d* may be formed at another corner of the first housing structure 210 or in any region between the upper corner and the lower corner. In another embodiment, the sensor region 231*d* may be disposed at a portion of the second housing structure 220. In another embodiment, the sensor region 231*d* may be formed to extend between the first housing structure 210 and the second housing structure 220. In one embodiment, to perform various functions, the electronic device 200 may include components exposed to the front surface of the electronic device 200 through the sensor region 213*d* or through one or more openings provided in the sensor region 231*d*. The components may include, for example, at least one of a front camera, a receiver, a proximity sensor, an illuminance sensor, an iris recognition sensor, an ultrasonic sensor, or an indicator.

In one embodiment, the first rear cover 240 may be disposed on the second surface 212 of the first housing structure 210 and may have a substantially rectangular periphery. In one embodiment, at least a portion of the periphery may be wrapped by the first housing structure 210. Similarly, the second rear cover 250 may be disposed on the fourth surface 222 of the second housing structure 220, and at least a portion of the periphery thereof may be wrapped by the second housing structure 220.

In the illustrated embodiment, the first rear cover 240 and the second rear cover 250 may have a substantially symmetrical shape with respect to the folding axis (A axis). In another embodiment, the first rear cover 240 and the second rear cover 250 may have various different shapes. In another embodiment, the first rear cover 240 may be formed as a single body with the first housing structure 210, and the second rear cover 250 may be formed as a single body with the second housing structure 220.

In one embodiment, the first rear cover 240, the second rear cover 250, the first housing structure 210, and the second housing structure 220 may be combined with each other so as to provide a space where various components (e.g., printed circuit board, antenna module, sensor module, and battery) of the electronic device 200 can be arranged. In one embodiment, one or more components may be disposed on or visually exposed via the rear surface of the electronic device 200. For example, one or more components or sensors may be visually exposed through the first rear region 241 of the first rear cover 240. The sensors may include a proximity sensor, a rear camera, and/or a flash. In another embodiment, at least a portion of the sub-display 252 may be visually exposed through the second rear region 251 of the second rear cover 250.

The display 200 may be disposed on the space formed by the pair of housing structures 210 and 220. For example, the display 200 may be seated in the recess (e.g., recess 201 in FIG. 2A) formed by the pair of housing structures 210 and 220, and may be disposed to substantially occupy most of the front surface of the electronic device 200. The front surface of the electronic device 200 may include the display 230, a portion (e.g., edge region) of the first housing structure 210 close to the display 230, and a portion (e.g. edge region) of the second housing structure 220 close to the display 230. In one embodiment, the rear surface of the electronic device 200 may include the first rear cover 240, a portion (e.g., edge region) of the first housing structure 210 close to the first rear cover 240, the second rear cover 250, and a portion (e.g. edge region) of the second housing structure 220 close to the second rear cover 250.

In one embodiment, the display 230 may refer to a display who's at least a portion may be deformed into a flat or curved surface. In one embodiment, the display 230 may include a folding region 231*c*, a first region 231*a* disposed on one side (e.g., right side of the folding region 231*c*) with respect to the folding region 231*c*, and a second region 231*b* disposed on the other side (e.g., left side of the folding region 231*c*). For example, the first region 231*a* may be disposed on the first surface 211 of the first housing structure 210, and the second region 231*b* may be disposed on the third surface 221 of the second housing structure 220. This demarcation of the display 230 is only an example, and the display 230 may be subdivided into plural regions (e.g., four or more regions) according to the structure or functionality. For example, in the embodiment of FIG. 2A, the area of the display 230 may be subdivided with respect to the folding area 231*c* or the folding axis (A axis) extending parallel to the y-axis. However, in another embodiment, the area of the display 230 may be subdivided with respect to a different folding region (e.g., folding region parallel to the x-axis) or a different folding axis (e.g., folding axis parallel to the x-axis). The aforementioned subdivision of the display is only a physical demarcation based on the pair of housing structures 210 and 220 and the hinge structure (e.g., hinge structure 264 in FIG. 3), and the display 230 may substantially present one full screen through the pair of housing structures 210 and 220 and the hinge structure (e.g., hinge structure 264 in FIG. 3). In one embodiment, the first region 231*a* and the second region 231*b* may have a symmetrical shape with respect to the folding region 231*c*. Although the first region 231*a* may include a notch region (e.g., notch region 233 in FIG. 3) cut according to the presence of the sensor region 231*d*, it may have a symmetrical shape with the second region 231*b* in other portions. In other words, the first region 231*a* and the second region 231*b* may include portions with symmetrical shapes and portions with asymmetrical shapes.

Figure 3:
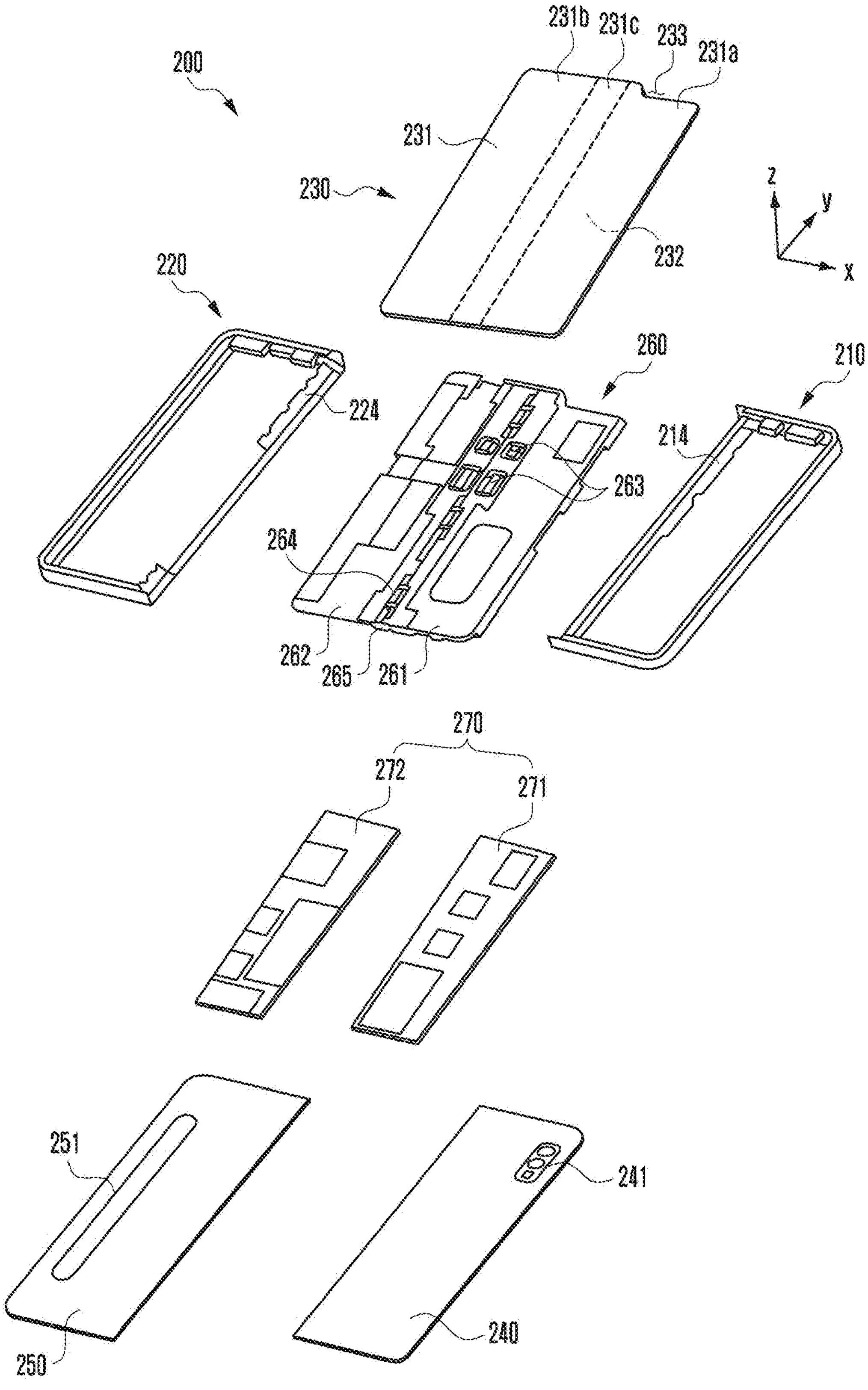
FIG. 3 is an exploded perspective view of the electronic device according to an embodiment of the disclosure.

Referring to FIG. 2B, the hinge cover 265 may be disposed between the first housing structure 210 and the second housing structure 220 so as to cover the internal components (e.g., hinge structure 264 in FIG. 3). In one embodiment, the hinge cover 265 may be covered by portions of the first housing structure 210 and the second housing structure 220 or be exposed to the outside according to the operating state (e.g., flat state or folded state) of the electronic device 200.

For example, when the electronic device 200 is in the flat state as shown in FIG. 2A, the hinge cover 265 may be covered by the first housing structure 210 and the second housing structure 220 so as not to be exposed. When the electronic device 200 is in the folded state (e.g., completely folded state) as shown in FIG. 2B, the hinge cover 265 may be exposed to the outside between the first housing structure 210 and the second housing structure 220. When the electronic device 200 is in the intermediate state where the first housing structure 210 and the second housing structure 220 make a certain angle, the hinge cover 265 may be partially exposed to the outside between the first housing structure 210 and the second housing structure 220. In this case, the exposed portion may be less than that for the fully folded state. In one embodiment, the hinge cover 265 may include a curved surface.

Next, a description is given of configurations of the first housing structure 210 and the second housing structure 220 and regions of the display 230 according to the operating state (e.g. flat state or folded state) of the electronic device 200.

In one embodiment, when the electronic device 200 is in the flat state (e.g., state of FIG. 2A), the first housing structure 210 and the second housing structure 220 may make an angle of 180 degrees, and the first region 231*a* and the second region 231*b* of the display may be disposed to face in the same direction. In addition, the folding region 231*c* may be coplanar with the first region 231*a* and the second region 231*b*.

In one embodiment, when the electronic device 200 is in the folded state (e.g., state of FIG. 2B), the first housing structure 210 and the second housing structure 220 may be disposed to face each other. The first region 231*a* and the second region 231*b* of the display 230 may face each other, making a narrow angle (e.g., between 0 degrees and 10 degrees). At least a portion of the folding area 231*c* may form a curved surface with a preset curvature.

In one embodiment, when the electronic device 200 is in the intermediate state, the first housing structure 210 and the second housing structure 220 may be disposed to make a certain angle. The first region 231*a* and the second region 231*b* of the display 230 may form an angle greater than that for the folded state and less than that for the flat state. At least a portion of the folding area 231*c* may form a curved surface with a preset curvature. This curvature may be less than that for the folded state.

FIG. 3 is an exploded perspective view of an electronic device according to an embodiment of the disclosure.

Referring to FIG. 3, in one embodiment, the electronic device 200 may include a display 230, a support member assembly 260, at least one printed circuit board 270, a first housing structure 210, a second housing structure 220, a first rear cover 240, and a second rear cover 250. In the description, the display 230 may be referred to as a display unit, display module, or display assembly.

The display 230 may include a display panel 231 (e.g., flexible display panel), and at least one plate 232 or layer on which the display panel 231 is seated. In one embodiment, the plate 232 may be disposed between the display panel 231 and the support member assembly 260. The display panel 231 may be disposed on at least a portion of one surface (e.g., surface in the Z direction in FIG. 3) of the plate 232. The plate 232 may be formed in a shape corresponding to the display panel 231. For example, a portion of the plate 232 may be formed in a shape corresponding to the notch region 233 of the display panel 231.

The support member assembly 260 may include a first support member 261, a second support member 262, a hinge structure 264 disposed between the first support member 261 and the second support member 262, a hinge cover 265 to cover the hinge structure 264 when viewed from the outside, and a wiring member 263 (e.g., flexible printed circuit board (FPCB)) that crosses the first support member 261 and the second support member 262.

In one embodiment, the support member assembly 260 may be disposed between the plate 232 and at least one printed circuit board 270. For example, the first support member 261 may be disposed between the first region 231*a* of the display 230 and the first printed circuit board 271. The second support member 262 may be disposed between the second region 231*b* of the display 230 and the second printed circuit board 272.

In one embodiment, at least a portion of the wiring member 263 and the hinge structure 264 may be disposed within the support member assembly 260. The wiring member 263 may be disposed in a direction crossing the first support member 261 and the second support member 262 (e.g., x-axis direction). The wiring member 263 may be disposed in a direction (e.g., x-axis direction) perpendicular to the folding axis (e.g., y-axis or folding axis (A) in FIG. 2A) of the folding region 231*c*.

The at least one printed circuit board 270 may include, as described above, the first printed circuit board 271 disposed on the side of the first support member 261, and the second printed circuit board 272 disposed on the side of the second support member 262. The first printed circuit board 271 and the second printed circuit board 272 may be disposed inside the space formed by the support member assembly 260, the first housing structure 210, the second housing structure 220, the first rear cover 240, and the second rear cover 250. Various components for implementing functions of the electronic device 200 may be mounted on the first printed circuit board 271 and the second printed circuit board 272.

In one embodiment, in a state where the display 230 is coupled to the support member assembly 260, the first housing structure 210 and the second housing structure 220 may be assembled to each other so as to be coupled to both sides of the support member assembly 260. As described below, the first housing structure 210 and the second housing structure 220 may be coupled to the support member assembly 260 by being slid on both sides of the support member assembly 260.

In one embodiment, the first housing structure 210 may include a first rotary support surface 214, and the second housing structure 520 may include a second rotary support surface 224 corresponding to the first rotary support surface 214. The first rotary support surface 214 and the second rotary support surface 224 may include a curved surface corresponding to the curved surface included in the hinge cover 265.

In one embodiment, when the electronic device 200 is in the flat state (e.g., state of FIG. 2A), the first rotary support surface 214 and the second rotary support surface 224 may cover the hinge cover 265 so that the hinge cover 265 may be not or minimally exposed to the rear surface of the electronic device 200. When the electronic device 200 is in the folded state (e.g., state of FIG. 2B), the first rotary support surface 214 and the second rotary support surface 224 may rotate along the curved surface included in the hinge cover 265 so that the hinge cover 265 may be maximally exposed to the rear surface of the electronic device 200.

The antenna according to various embodiments of the disclosure may be applied to the first housing structure, and may be configured to shift in a relatively wide range of a low band without degrading radiation performance. Next, a description is given of the antenna.

Figure 4A:
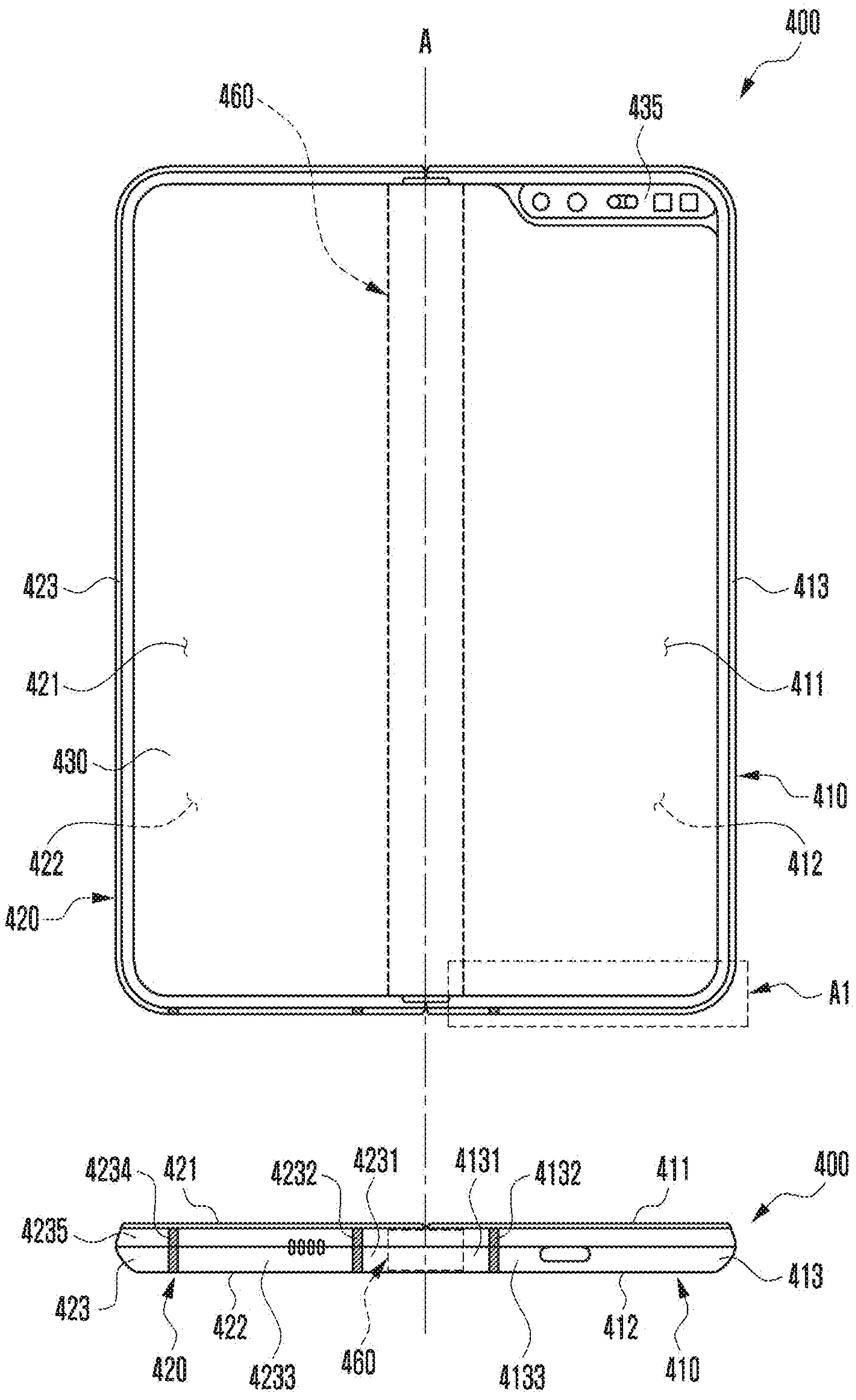
FIGS. 4A and 4B are a view of the electronic device illustrating the arrangement of conductive portions segmented by a single non-conductive portion according to various embodiments of the disclosure.
Figure 4B:
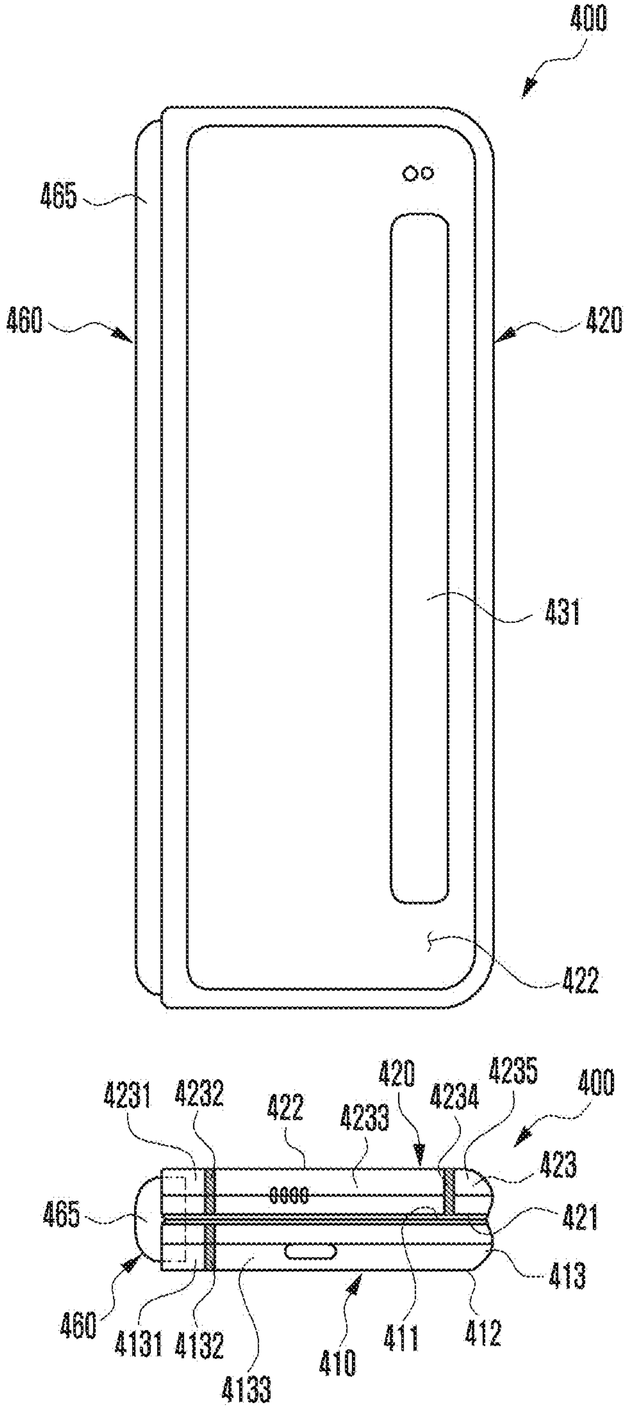

FIGS. 4A and 4B are a view of an electronic device illustrating the arrangement of conductive portions segmented by a single non-conductive portion according to various embodiments of the disclosure.

Embodiments for the electronic device 400 of FIGS. 4A and 4B may be at least partially similar to or different from those for the electronic device 200 of FIGS. 2A to 3.

Referring to FIG. 4A, the electronic device 400 may include foldable housing structures 410 and 420 rotatably arranged with respect to the folding axis A. In one embodiment, the foldable housing structures may include a first housing structure 410 and a second housing structure 420. In one embodiment, the first housing structure 410 and the second housing structure 420 may be rotatably coupled via the hinge structure 460 (e.g., hinge structure 264 in FIG. 3) having a hinge cover 465. For example, through the hinge structure 460, the first housing structure 410 and the second housing structure 420 may be folded to face each other with respect to the folding axis A, or may be unfolded to be coplanar.

In various embodiments, the first housing structure 410 may include a first surface 411 facing in a first direction (e.g., Z-axis direction in FIG. 3), a second surface 412 facing in a second direction opposite to the first direction (e.g., negative Z-axis direction in FIG. 3), and a first side member 413 enclosing at least a portion of the space between the first surface 411 and the second surface 412. In one embodiment, at least a portion of the first side member 413 may be made of a conductive member (e.g., metal member). In one embodiment, at least a portion of the conductive member of the first side member 413 may be applied as an antenna (A1). In one embodiment, the first side member 413 may include a first conductive portion 4131, a first non-conductive portion 4132, and a second conductive portion 4133 arranged in sequence from the hinge structure 460.

In various embodiments, the second housing structure 420 may include a third surface 421 facing in a third direction (e.g., Z-axis direction in FIG. 3), a fourth surface 422 facing in a fourth direction opposite to the third direction (e.g., negative Z-axis direction in FIG. 3), and a second side member 423 enclosing at least a portion of the space between the third surface 421 and the fourth surface 422. In one embodiment, at least a portion of the second side member 423 may be made of a conductive member. In one embodiment, the second side member 423 may include a third conductive portion 4231, a second non-conductive portion 4232, a fourth conductive portion 4233, a third non-conductive portion 4234, and/or a fifth conductive portion 4235 arranged in sequence from the hinge structure 460.

In various embodiments, when the first housing structure 410 and the second housing structure 420 are unfolded with 180 degrees, the first surface 411 and the third surface 421 may be formed to be of a planar shape facing the same direction (e.g., Z-axis direction in FIG. 3). In one embodiment, the electronic device 400 may include a display 430 disposed to cross the first surface 411 of the first housing structure 410 and the third surface 421 of the second housing structure 420. For example, when the first housing structure 410 and the second housing structure 420 are folded with respect to the folding axis A so that the first surface 411 and the third surface 421 face each other, the display 430 may also be folded with respect to the folding axis A. In one embodiment, the display 430 may be not disposed on at least a portion of the first surface 411 of the first housing structure 410 and a separate sensor region 435 may be disposed thereon. In another embodiment, the sensor region 435 may be disposed on at least a portion of the third surface 421 of the second housing structure 420 or may be disposed on a portion extending to the first surface 411 and the third surface 421.

In various embodiments, the electronic device 400 may be provided with an antenna A1 formed using a portion (e.g., lower portion) of the first side member 413 of the first housing structure 410. In one embodiment, the antenna A1 may be formed through the second conductive portion 4133 segmented by the first non-conductive portion 4132 of the first side member 413. In this case, the second conductive portion 4133 may be formed to have an electrical length relatively longer than that of the antenna formed as the unit conductive portion by a pair of non-conductive portions. In another embodiment, the antenna A1 may be disposed in an upper region of the first housing structure 410 or in a side region connecting the upper region and the lower region thereof.

In various embodiments of the disclosure, the antenna A1 may include a pair of feeders disposed at different positions from the first non-conductive portion 4132, and may be configured to reduce the degradation of the radiation performance in the low band and to shift in a relatively wide bandwidth through selective feeding of the feeders.

In one embodiment of the disclosure, the antenna A1 may be configured to operate in a lower frequency band compared with the case of direct feeding by forming at least one of the pair of feeders through coupled feeding although the second conductive portion 4133 has the same electrical length. In one embodiment, the antenna A1 may be configured to shift the frequency in the range of 750 MHz to 1200 MHz in the low band.

Referring to FIG. 4B, when the first housing structure 410 and the second housing structure 420 of the electronic device 400 are folded to face each other, the second non-conductive portion 4232 of the second housing structure 420 may be disposed to overlap with the first non-conductive portion 4132 of the first housing structure 410 when the second surface 412 of the first housing structure 410 is viewed from the top. In one embodiment, when the electronic device 400 is folded, the fourth conductive portion 4333 of the second housing structure 420 may reduce the radiation performance of the antenna (antenna A1 in FIG. 4A) formed by the second conductive portion 4133. For example, if the fourth conductive portion 4333 has an electrical length that is the same or similar to the operating frequency band of the second conductive portion 4133, the current applied to the second conductive portion 4133 may induce an unwanted current in the fourth conductive portion 4333, and this unwanted current may cause parasitic resonance that degrades the radiation performance of the second conductive portion 4133. To prevent this problem, the fourth conductive portion 4333 of the second housing structure 420 may be segmented by the second non-conductive portion 4132 and the third non-conductive portion 4234 into a unit conductive portion (fourth conductive portion 4333), and the fourth conductive portion 4333 being a unit conductive portion may be induced to be out-band outside the operating frequency band of the second conductive portion 4133. In another embodiment, the third non-conductive portion 4234 may be disposed at various positions to prevent interference to the operating frequency band of the second conductive portion 4133.

Figure 5:
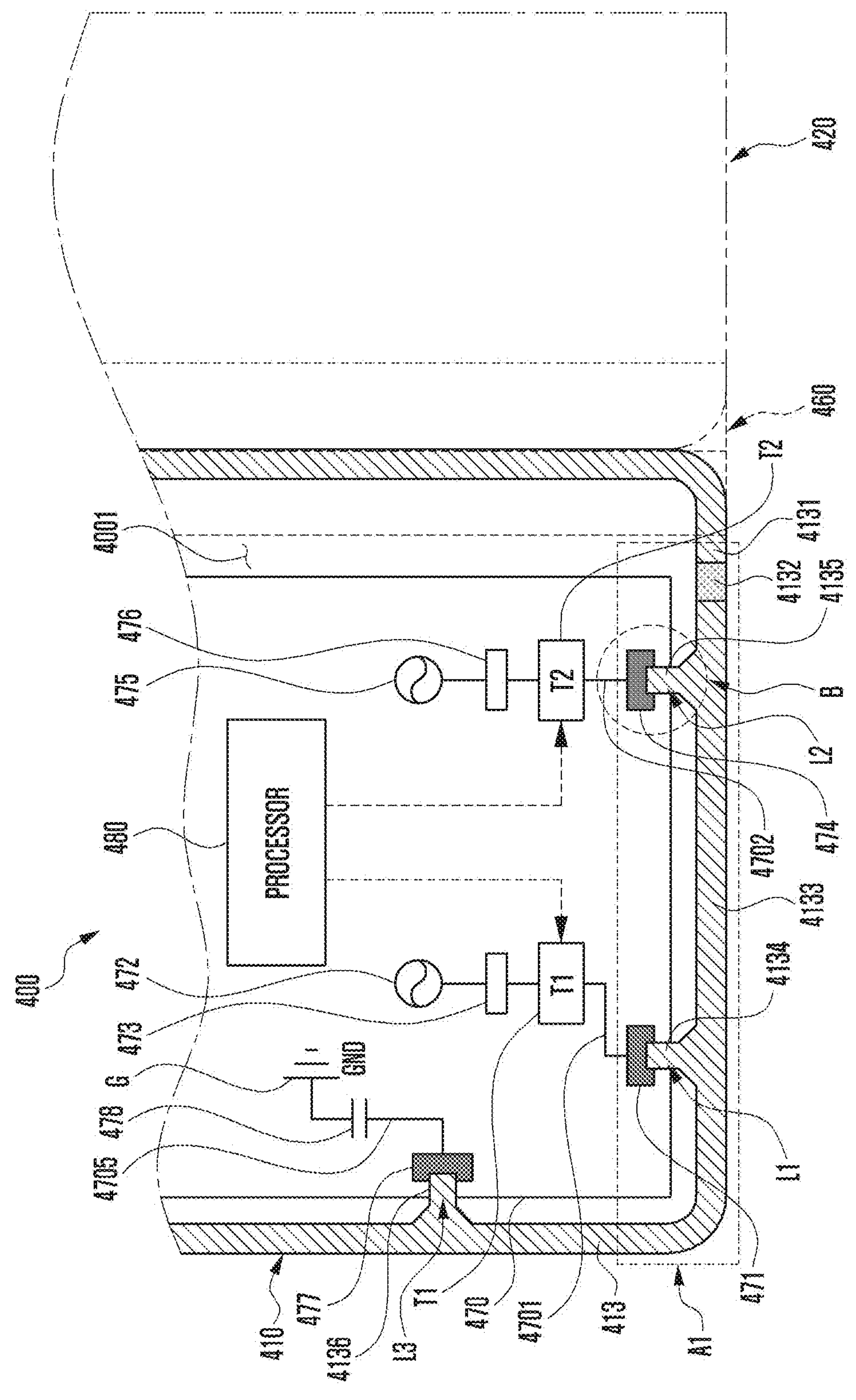
FIG. 5 is a view of the electronic device illustrating the arrangement of the antenna according to an embodiment of the disclosure.
Figure 6A:
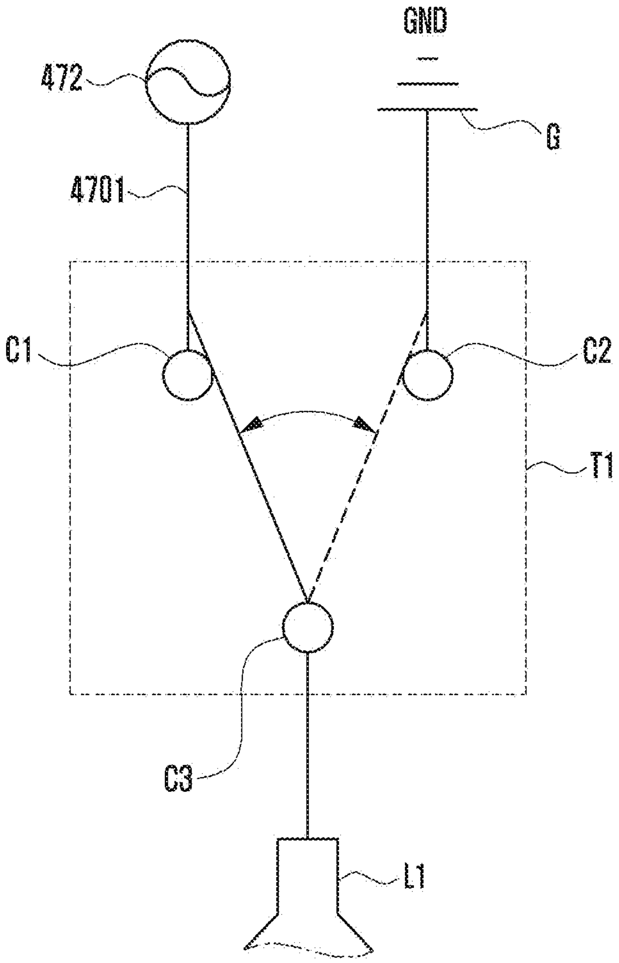
FIGS. 6A and 6B illustrate the configuration of the variable elements T1 and T2 shown in FIG. 5 according to various embodiments of the disclosure.
Figure 6B:
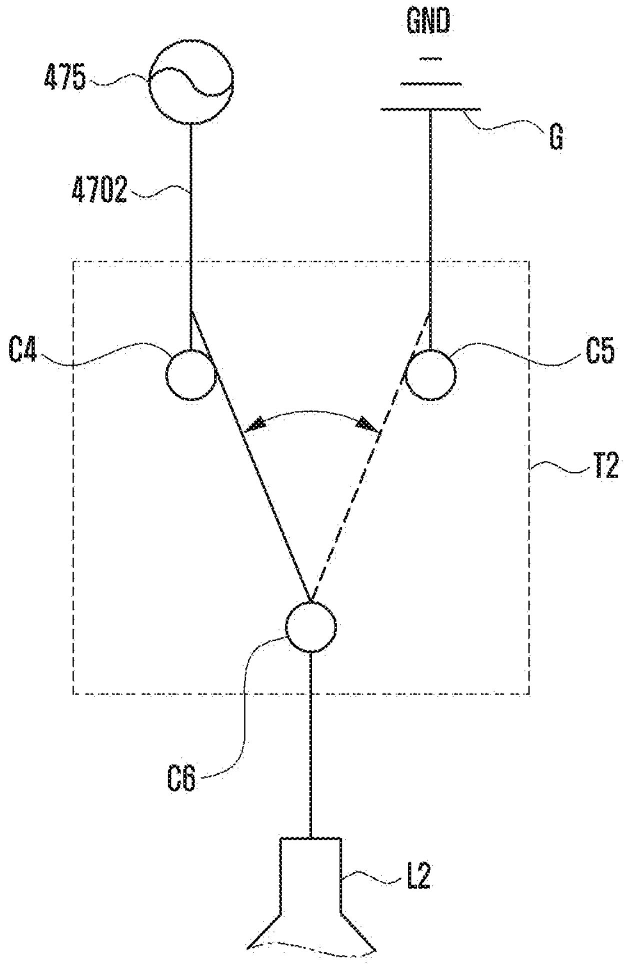

FIG. 5 is a view of an electronic device illustrating the arrangement of the antenna according to various embodiments of the disclosure. FIGS. 6A and 6B illustrate the configuration of the variable elements T1 and T2 shown in FIG. 5 according to an embodiment of the disclosure.

FIG. 5 illustrates the configuration of the antenna A1 when the second surface of the first housing structure 410 (e.g., second surface 412 in FIG. 4A) is viewed from above.

Referring to FIG. 5, the electronic device 400 may include a first housing structure 410 and a second housing structure 420 rotatably disposed with respect to each other. In one embodiment, the first housing structure 410 and the second housing structure 420 may be rotatably connected via the hinge structure 460. For example, the first housing structure 410 and the second housing structure 420 are not separated from each other due to the hinge structure 460 and may be folded to face each other or be unfolded to be coplanar.

In various embodiments, the first housing structure 410 may include a first surface 411 facing in a first direction (e.g., Z-axis direction in FIG. 3), a second surface 412 facing in a second direction opposite to the first direction (e.g., negative Z-axis direction in FIG. 3), and a first side member 413 enclosing at least a portion of the space 4001 between the first surface 411 and the second surface 412. In one embodiment, the first side member 413 may include a first conductive portion 4131, a first non-conductive portion 4132, and a second conductive portion 4133 arranged in sequence from the hinge structure 460.

In various embodiments, the first side member 413 may include a first connection piece 4134 formed at a first position L1 and/or a second connection piece 4135 formed at a second position L2 from the first non-conductive portion 4132. The second position L2 may be closer to the first non-conductive portion 4132 than the first position L1. In one embodiment, the first connection piece 4134 and the second connection piece 4135 may each be formed as a single body with the first side member 413. For example, the first connection piece 4134 and the second connection piece 4135 may be disposed to overlap with at least a portion of the printed circuit board 470 disposed in a region of the space 4001 formed by the first side member 413.

In various embodiments, the electronic device 400 may include the printed circuit board 470 disposed in the internal space 4001 of the first side member 413. In one embodiment, the printed circuit board 470 may include a first connection portion 471 (e.g., conductive pad) electrically connected to the first connection piece 4134. For example, the first connection piece 4134 may be electrically connected to the first connection portion 471 of the printed circuit board 470 as the printed circuit board 470 is mounted in the space 4001. Alternatively, the first connection piece 4134 may be electrically connected to the first connection portion 471 of the printed circuit board 470 through a separate electrical connection part (e.g., C clip or conductive contact). In one embodiment, the printed circuit board 470 may include a first electrical path 4701 (e.g., wiring line) ranging from the first connection portion 471 to a first feeder 472 (e.g., wireless communication circuit). In one embodiment, the first feeder 472 may transmit a first signal of a first frequency band at the first position L1 of the second conductive portion 4133 electrically connected through the first electrical path 4701. Here, the first frequency band may be in the range of about 900 MHz to 1200 MHz.

FIGS. 6A and 6B illustrate the configuration of the variable elements T1 and T2 shown in FIG. 5 according to various embodiments of the disclosure.

Referring to FIG. 6A, in various embodiments, a first variable element T1 may be disposed in the middle of the first electrical path 4701. In one embodiment, the first variable element T1 may include a tuner that includes a first terminal C1 electrically connected to the first electrical path 4701, a second terminal C2 electrically connected to the ground layer G of the printed circuit board 470, and a third terminal C3 electrically connected to the first position L1 of the second conductive portion 4133. In another embodiment, the first variable element T1 may include a plurality of passive elements for selective switching. In one embodiment, because the printed circuit board 470 is in direct electrical contact with the first housing structure 410 constituting the external appearance of the electronic device 400, an electric shock prevention circuit 473 may be further included in the first electrical path 4701 to prevent electric shock caused by electrostatic discharge (ESD).

In various embodiments, the printed circuit board 470 may include a second connection portion 474 electrically connected to the second connection piece 4135. In one embodiment, the second connection piece 4135 and the printed circuit board 470 may be electrically connected to the second connection portion 474 of the printed circuit board 470 via coupled feeding. As the second conductive portion 4133 is electrically connected to the printed circuit board 470 through coupled feeding, the capacitor configuration between conductors makes the electrical length of the second conductive portion 4133 longer, thereby extending the frequency shift range in the low band. In one embodiment, the printed circuit board 470 may include a second electrical path 4702 (e.g., wiring line) ranging from the second connection portion 474 to a second feeder 475 (e.g., wireless communication circuit). In one embodiment, the second feeder 475 may transmit a second signal of a second frequency band at the second position L2 of the second conductive portion 4133 electrically connected through the second electrical path 4702. Here, the second frequency band may be in the range of about 750 MHz to 850 MHz.

Referring to FIG. 6B, in various embodiments, a second variable element T2 may be disposed in the middle of the second electrical path 4702. In one embodiment, the second variable element T2 may include a switch that includes a fourth terminal C4 electrically connected to the second electrical path 4702, a fifth terminal C5 electrically connected to the ground layer G of the printed circuit board 470, and a sixth terminal C6 coupled to the second position L2 of the second conductive portion 4133. In another embodiment, the second variable element T2 may include a plurality of passive elements or tunable ICs for selective switching. In one embodiment, because the printed circuit board 470 is in direct electrical contact with the first housing structure 410 constituting the external appearance of the electronic device 400, an electric shock prevention circuit 476 may be further included in the second electrical path 4702 to prevent electric shock caused by electrostatic discharge (ESD).

In various embodiments, the printed circuit board 470 in region B may include a third electrical path (e.g., third electrical path 4703 in FIG. 7A) and/or a fourth electrical path (e.g., fourth electrical path 4704 in FIG. 7B) electrically connecting the second position L2 of the second conductive portion 4133 and the second variable element T2.

In various embodiments, the first side member 413 may include a third connection piece 4136 disposed at a third position L3. In one embodiment, the third connection piece 4136 may be formed to extend from the first side member 413 toward the space 4001. In one embodiment, the printed circuit board 470 may include a third connection portion 477 (e.g., conductive pad) electrically connected to the third connection piece 4136. For example, the third connection piece 4136 may be electrically connected to the third connection portion 477 of the printed circuit board 470 as the printed circuit board 470 is mounted in the space 4001. Alternatively, the third connection piece 4136 may be electrically connected to the third connection portion 477 of the printed circuit board 470 through a separate electrical connection part (e.g., C clip or conductive contact). In one embodiment, the printed circuit board 470 may include a fifth electrical path 4705 (e.g., wiring line) ranging from the third connection portion 477 to the ground layer G of the printed circuit board 470. In one embodiment, the printed circuit board 470 may include an electric shock prevention capacitor 478 in the middle of the fifth electrical path 4705.

In various embodiments, the antenna (e.g., antenna A1 in FIG. 4A) may be shifted in various ranges of the low band through selective feeding of the first feeder 472 and/or the second feeder 475 with the second conductive portion 4133 of the first side member 413 and through impedance matching using the first variable element T1 and/or the second variable element T2. For example, feeding through the second feeder 475 coupled with the second conductive portion 4133 enables the antenna to perform shifting in a wider frequency range of the low band with a reduction in radiation performance degradation.

In various embodiments, the processor 480 of the electronic device 400 may collect state information of the electronic device (e.g., local information, channel information, voice or data communication information, grip information, or proximity information) through at least one sensor, and determine the current mode based on the collected state information. The processor 480 may control the first variable element T1 and/or the second variable element T2 according to the determined mode to thereby change the operating frequency range of the second conductive portion 4133 in the low band. For example, through the first variable element T1 and/or the second variable element T2, the processor 480 may control the antenna radiator utilizing the second conductive portion 4133 to selectively operate at various operating frequencies of the low band (e.g., 750 MHz to 1200 MHz) without radiation performance degradation.

Figure 7A:
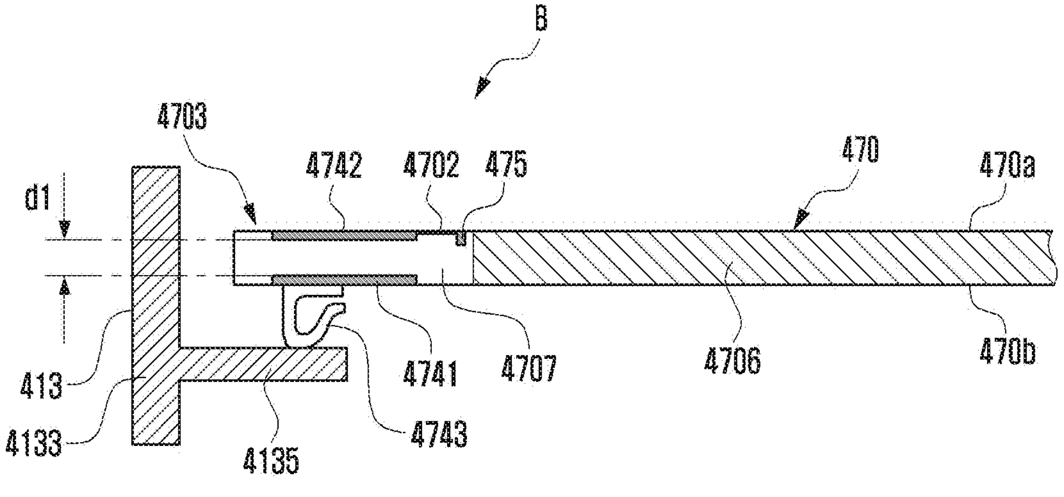
FIGS. 7A and 7B illustrate the electrical connection between a second connection piece and a printed circuit board according to various embodiments of the disclosure.
Figure 7B:
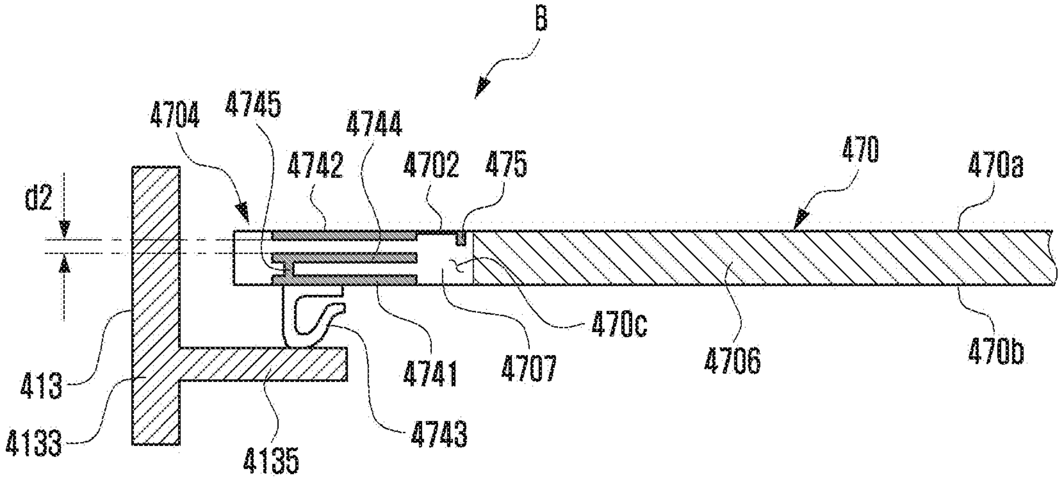

FIGS. 7A and 7B illustrate the electrical connection between a second connection piece and a printed circuit board according to various embodiments of the disclosure.

FIGS. 7A and 7B are cross-sectional views of a region B where the second feeder 475 and the second conductive portion 4133 are coupled fed.

Referring to FIG. 7A, the printed circuit board 470 may include a third electrical path 4703 electrically connecting the second position (e.g., second position L2 in FIG. 5) of the second conductive portion 4133 and the second variable element (e.g., second variable element T2 in FIG. 5). In one embodiment, the printed circuit board 470 may include a first substrate surface 470*a* and a second substrate surface 470*b* facing away from the first substrate surface 470*a*. In one embodiment, the printed circuit board 470 may include a first region 4706 (e.g., ground layer) and a second region 4707 (e.g., fill-cut region). In one embodiment, the printed circuit board 470 may include, when a first conductive pad 4472 disposed on the first substrate surface 470*a* in the second region 4707 and the first substrate surface 470*a* are viewed from above, a second conductive pad 4471 that is formed on the second substrate surface 470*b* so as to at least partially overlap with the first conductive pad 4472 (e.g., second connection portion 474 in FIG. 5). In one embodiment, the first conductive pad 4472 may be electrically connected to the second feeder 475 through the second electrical path 4702 formed in the printed circuit board 470. In one embodiment, the second conductive pad 4471 may be electrically connected to the second connection piece 4135 extending from the second conductive portion 4133 of the first side member 413 through an electrical connection member 4477. In one embodiment, the electrical connection member 4743 may be in physical contact with the second connection piece 4135 and the second conductive pad 4741.

In various embodiments, the first conductive pad 4742 and the second conductive pad 4741 spaced apart by a first interval d1 in the printed circuit board 470 may be operated as a capacitor configuration. In one embodiment, the capacitance of the capacitor configuration may be determined according to the overlapping area between the first conductive pad 4742 and the second conductive pad 4741, and thus impedance matching of the antenna may be achieved.

Referring to FIG. 7B, the capacitance may be determined by adjusting the spacing between the first conductive pad 4742 and the second conductive pad 4741. In one embodiment, the printed circuit board 470 may include a fourth electrical path 4704 electrically connecting the second position (e.g., second position L2 in FIG. 5) of the second conductive portion 4133 and the second variable element (e.g., second variable element T2 in FIG. 5). In one embodiment, the printed circuit board 470 may include a third conductive pad 4744 disposed between the first conductive pad 4742 and the second conductive pad 4741. In one embodiment, the third conductive pad 4744 may be formed as a pattern on one of the dielectric layers 470*c* of the printed circuit board 470. In one embodiment, the third conductive pad 4744 may be electrically connected to the second conductive pad 4741 through at least one conductive via 4745. Hence, the second interval d2 between the third conductive pad 4744 and the first conductive pad 4742 for a capacitor configuration may be less than the first interval d1. This may be advantageous for determining the specified capacitance when the mounting space of the conductive pads 4742 and 4741 is insufficient.

Figure 8A:
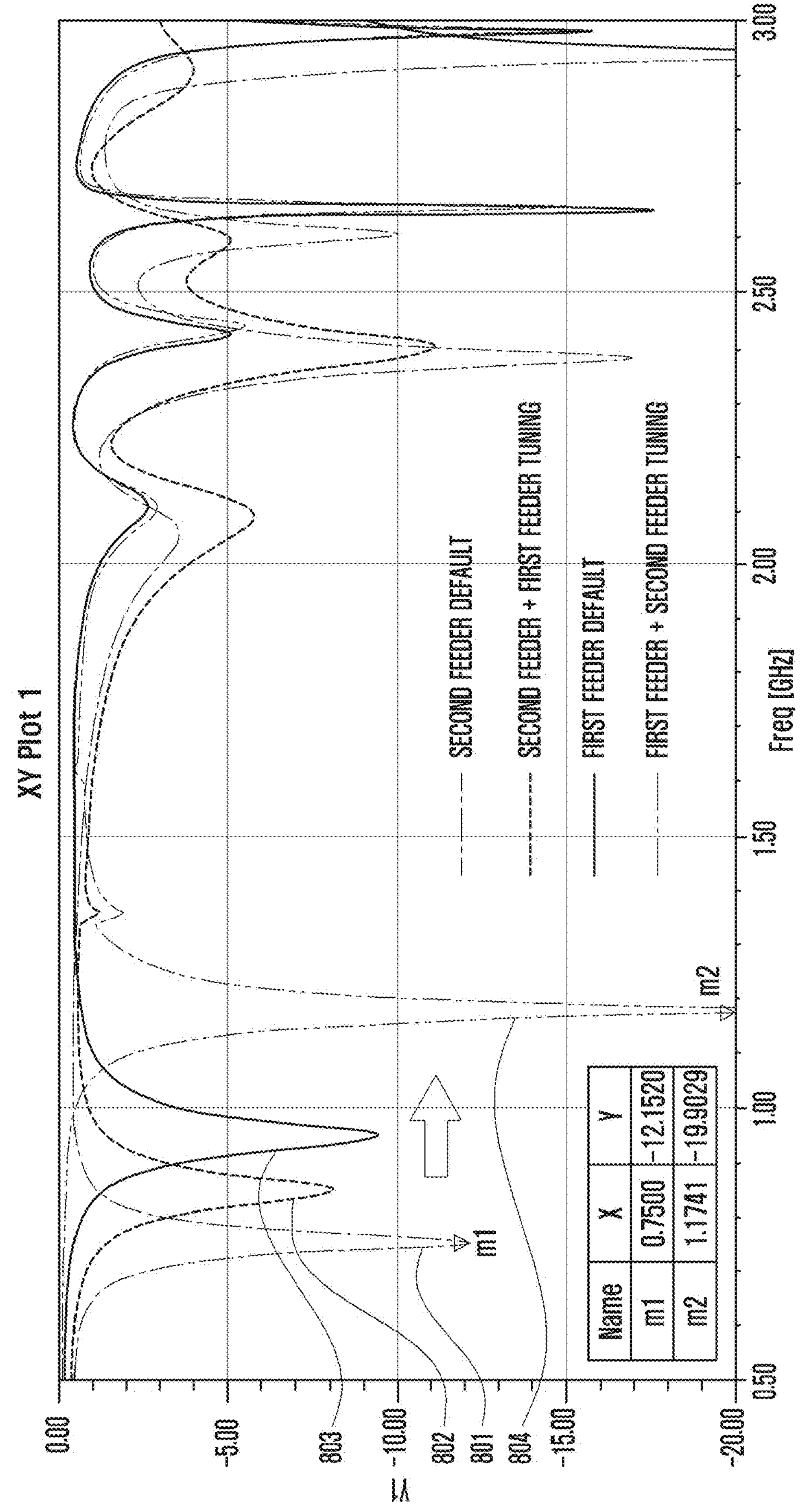
FIG. 8A is a return loss (S11) chart illustrating changes in the operating band of the antenna due to adjustment of a first feeder and a second feeder according to an embodiment of the disclosure.

FIG. 8A is a return loss (S11) chart illustrating changes in the operating band of the antenna due to adjustment of the first feeder and the second feeder according to an embodiment of the disclosure.

Referring to FIG. 8A, the following can be seen from the chart. The antenna having the configuration shown in FIG. 5 operates at a low frequency (e.g., about 750 MHz) in a low band when the second feeder (e.g., second feeder 475 in FIG. 5) is the default (graph 801). When the second feeder (e.g., second feeder 475 in FIG. 5) is the default and the first feeder (e.g., first feeder 472 in FIG. 5) is tuned through the first variable element (e.g., first variable element T1 in FIG. 5), the antenna shifts to a higher frequency (e.g., about 850 MHz) (graph 802). When the first feeder (e.g., first feeder 472 in FIG. 5) is the default, the antenna shifts to a higher frequency (e.g., about 950 MHz) (graph 803). When the first feeder (e.g., first feeder 472 in FIG. 5) is the default and the second feeder (e.g., second feeder 475 in FIG. 5) is tuned through the second variable element (e.g., second variable element T2 in FIG. 5), the antenna shifts to a higher frequency (e.g., about 1170 MHz) (graph 804). Hence, when a pair of feeders (e.g., first feeder 472 and second feeder 475 in FIG. 5) are provided at different positions of one conductive portion (e.g., second conductive portion 4133 in FIG. 5) and coupled feeding is applied to one of the feeders (e.g., second feeder 475 in FIG. 5), it can be seen that the frequency band shifts in the range of about 750 MHz to 1200 MHz in the low band.

Figure 8B:
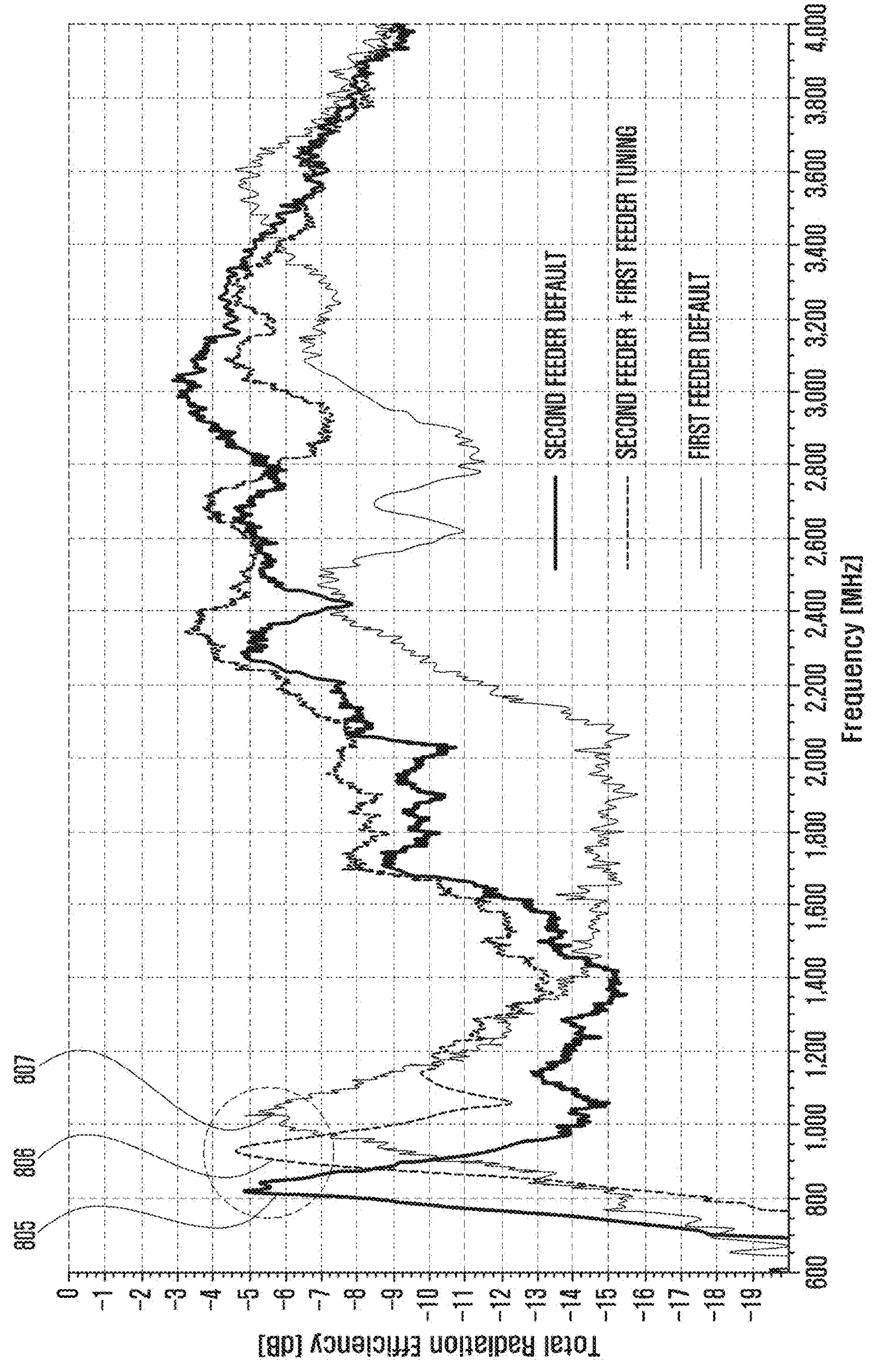
FIG. 8B is a chart illustrating performance of the antenna for each operating band due to adjustment of the first feeder and the second feeder according to an embodiment of the disclosure.

FIG. 8B is a chart illustrating performance of the antenna for each operating band due to adjustment of the first feeder and the second feeder according to an embodiment of the disclosure.

Referring to FIG. 8B, for the antenna having the configuration shown in FIG. 5, graph 805 indicates a case where the second feeder (e.g., second feeder 475 in FIG. 5) is the default. Graph 806 indicates a case where the second feeder (e.g., second feeder 475 in FIG. 5) is the default and the first feeder (e.g., first feeder 472 in FIG. 5) is tuned through the first variable element (e.g., first variable element T1 in FIG. 5). Graph 807 indicates a case where the first feeder (e.g., first feeder 472 in FIG. 5) is the default. It can be seen that even if the frequency shifts in the direction toward higher frequencies, the efficiency (radiation performance) is not lowered as indicated by the circular dotted line.

Figure 9A:
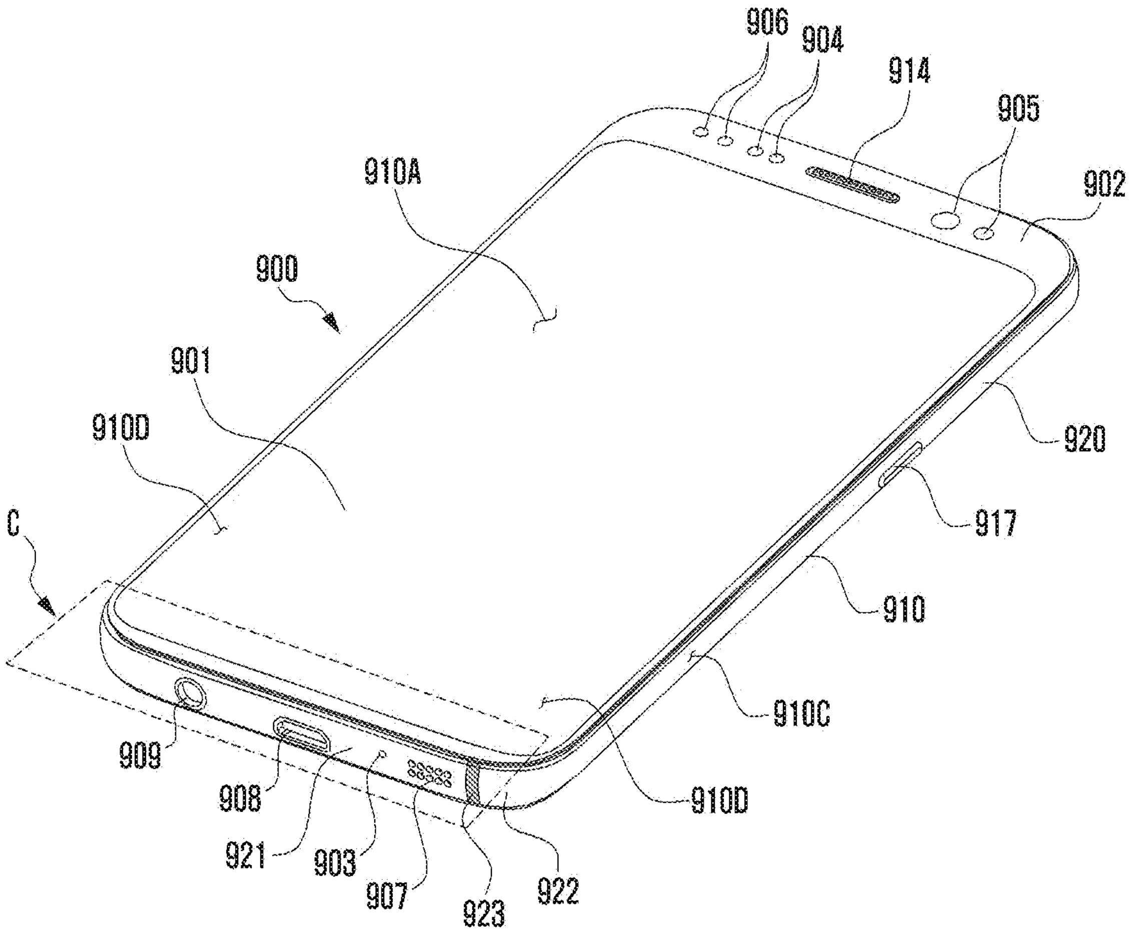
FIGS. 9A and 9B are perspective views of the electronic device viewed from different angles according to various embodiments of the disclosure.
Figure 9B:
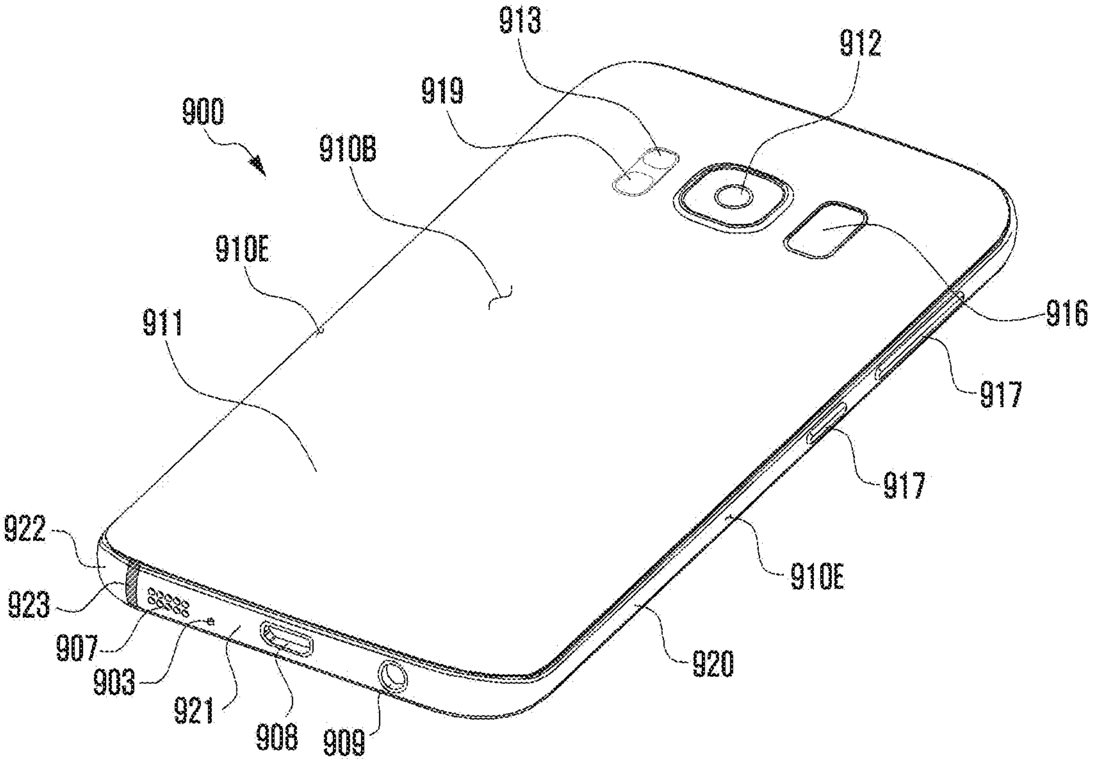

FIGS. 9A and 9B are perspective views of the electronic device viewed from different angles according to various embodiments of the disclosure.

Embodiments for the electronic device of FIGS. 9A and 9B may be at least partially similar to or different from those for the electronic device 101 of FIG. 1.

The antenna structure according to the various embodiments of the disclosure is applied to a folder type electronic device as described above, but it may also be applied to a bar type electronic device as described below.

Referring to FIGS. 9A and 9B, the electronic device 900 may include a first surface (or front surface) 910A, a second surface (or rear surface) 910B, and a housing 910 including a side surface 910C enclosing the space between the first surface 910A and the second surface 910B. In a different embodiment, the housing may refer to a structure forming some of the first surface 910A, the second surface 910B, and the side surface 910C shown in FIG. 1. In one embodiment, at least a portion of the first surface 910A may be made of a substantially transparent front plate 902 (e.g., glass plate or polymer plate including various coating layers). The second surface 910B may be made of a substantially opaque rear plate 911. The rear plate 911 may be made of, for example, coated or colored glass, ceramic, polymer, metal (e.g., aluminum, stainless steel (STS), or magnesium), or a combination thereof. The side surface 910C is coupled to the front plate 902 and the rear plate 911, and may be made of a side member 920 (or "side bezel structure") containing metal and/or polymer. In a certain embodiment, the rear plate 911 and the side member 920 may be formed as a single body, and may contain the same material (e.g., metal material such as aluminum).

In the illustrated embodiment, the front plate 902 may include a first region 910D, which is curved and seamlessly extended from the first surface 910A toward the rear plate, at both ends of the long edge. In the illustrated embodiment (FIG. 9B), the rear plate 911 may include a second region 910E, which is curved and seamlessly extended from the second surface 910B toward the front plate, at both ends of the long edge. In one embodiment, the front plate 902 or the rear plate 911 may include only one of the first region 910D and the second region 910E. In a certain embodiment, the front plate 902 may include only a flat plane disposed parallel to the second surface 910B without including the first region or the second region. In the above embodiments, when viewed from the side of the electronic device, the side bezel structure 918 may have a first thickness (or width) on the side where the first region 910D or the second region 910E is not included, and may have a second thickness less than the first thickness on the side where the first region or the second region is included.

In one embodiment, the electronic device 900 may include one or more of a display 901, an input unit 903, a sound output unit 907 or 914, a sensor module 904 or 919, a camera module 905, 912 or 913, a key input unit 917, an indicator 916, and a connector 908 or 909. In another embodiment, at least one of the components (e.g., key input unit 917 or indicator 906) of the electronic device 900 may be omitted, or a new component may be added to the electronic device 900.

The display 901 may be exposed through a substantial portion of front plate 902. In one embodiment, at least a portion of the display 901 may be exposed through the front plate 902 forming the first surface 910A and a first region 910D of the side surface 910C. The display 901 may be disposed in combination with or adjacent to the touch sensing circuit, the pressure sensor capable of measuring the strength (pressure) of a touch, and/or the digitizer for detecting a magnetic stylus pen. In one embodiment, at least a portion of the sensor module 904 or 919 and/or at least a portion of the key input unit 917 may be disposed in the first region 910D and/or the second region 910E.

The input unit 903 may include a microphone 903. The input device 903 may include a plurality of microphones 903 arranged to identify the direction of a sound. The sound output unit 907 or 914 may include speakers 907 and 914. The speakers 907 and 914 may include an external speaker 907 and a call receiver 914. In one embodiment, the microphone 903, the speakers 907 and 914, and the connectors 908 and 909 may be disposed in the above space of the electronic device 900 and may be exposed to the external environment through at least one hole formed in the housing 910. In one embodiment, the hole formed in the housing 910 may be commonly used for the microphone 903 and the speakers 907 and 914. The sound output unit 907 or 914 may include a speaker (e.g. piezo speaker) that operates without using the hole formed in the housing 910.

The sensor module 904 or 919 may generate an electric signal or data value corresponding to the operating state of the electronic device 900 or the external environmental state. The sensor modules 904 and 919 may include, for example, a first sensor module 904 (e.g., proximity sensor) disposed on the first surface 910A of the housing 910, a second sensor module (not shown) (e.g., fingerprint sensor), and/or a third sensor module 919 (e.g., HRM sensor) disposed on the second surface 910B of the housing 910. The fingerprint sensor may be disposed below the first surface 910A (e.g., home key button 915) of the housing 910, at a portion of the second surface 910B, or below the display 901. The electronic device 900 may further include at least one of, for example, a gesture sensor, a gyro sensor, an air pressure sensor, a magnetic sensor, an acceleration sensor, a grip sensor, a color sensor, an infrared sensor, a biometric sensor, a temperature sensor, a humidity sensor, or an illuminance sensor (not shown).

The camera module 905, 912 and 913 may include a first camera 905 disposed on the first surface 910A of the electronic device 900, a second camera 912 disposed on the second surface 910B, and/or a flash 913. The camera module 905 or 912 may include one or more lenses, an image sensor, and/or an image signal processor. The flash 913 may include, for example, a light emitting diode or a xenon lamp. In a certain embodiment, two or more lenses (wide angle and telephoto lenses) and image sensors may be disposed on one surface of the electronic device 900.

The key input unit 917 may be disposed on the side surface 910C of the housing 910. In another embodiment, the key input unit 917 of the electronic device 900 may include soft keys implemented on the display 901 without including physical keys. In one embodiment, the key input unit 917 may be implemented using a pressure sensor embedded in the display 901.

The indicator 906 may be disposed, for example, on the first surface 910A of the housing 910. The indicator 906 may provide, for example, state information of the electronic device 900 in the form of light. In another embodiment, the indicator 906 may provide, for example, a light source linked to operations of the camera module 905. The indicator 906 may include, for example, an LED, an IR LED, or a xenon lamp.

The connector holes 908 and 909 may include a first connector hole 908 to accommodate a connector (e.g., USB connector) for transmitting and receiving power and/or data to and from an external electronic device, and a second connector hole 909 (or, earphone jack) to accommodate a connector for transmitting and receiving an audio signal to and from an external electronic device.

In various embodiments, at least a portion of the side member 920 may be made of a conductive member (e.g., metal member). In one embodiment, the side member 920 may include a first conductive portion 921, a second conductive portion 922, and a non-conductive portion 923 formed between the first conductive portion 921 and the second conductive portion 922. In one embodiment, the antenna C of the disclosure may be formed by using the first conductive portion 921 segmented by the non-conductive portion 923.

Figure 10:
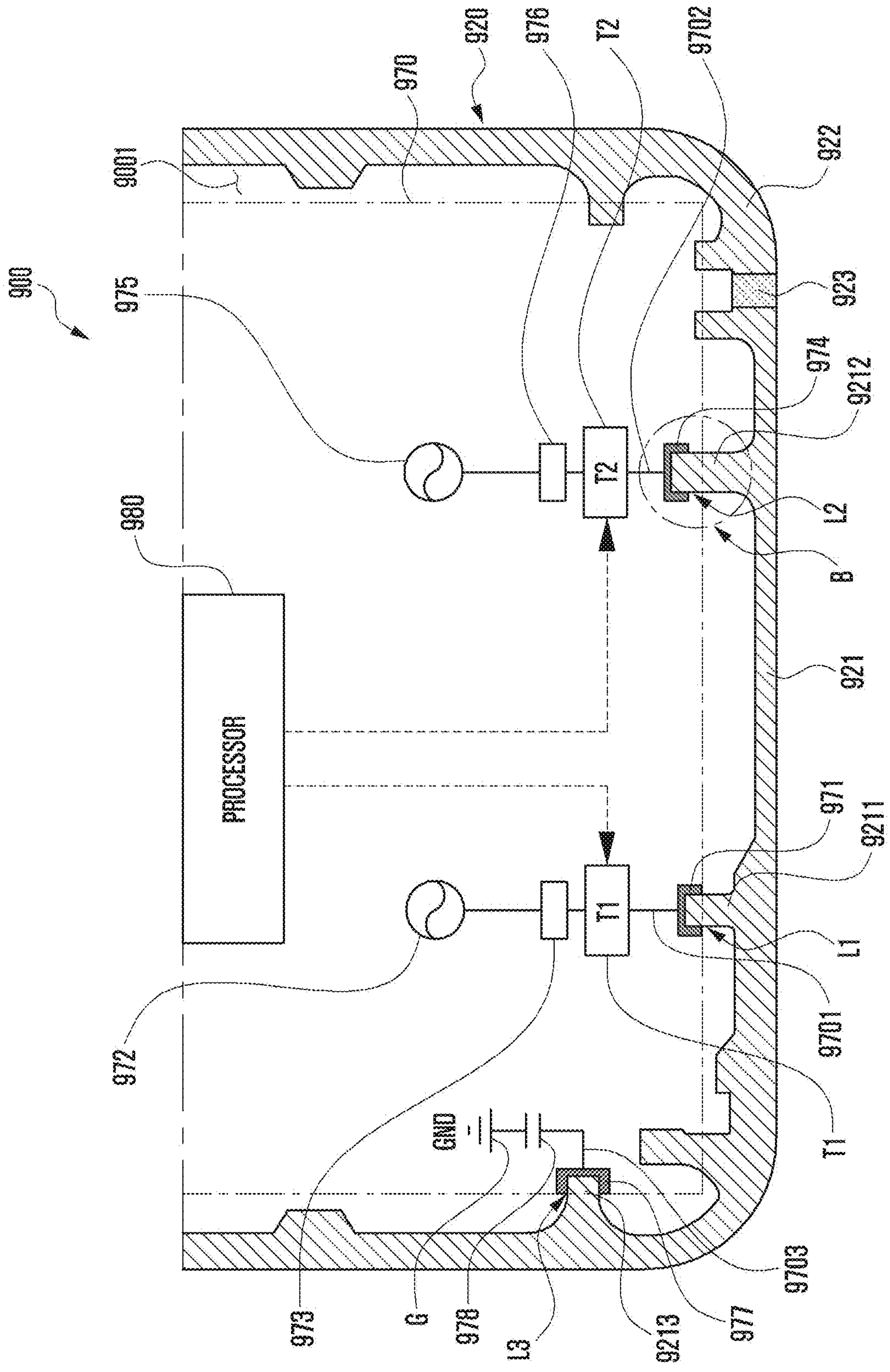
FIG. 10 illustrates the arrangement of the antenna in the electronic device shown in FIG. 9A according to an embodiment of the disclosure.

FIG. 10 illustrates the arrangement of the antenna in the electronic device shown in FIG. 9A according to an embodiment of the disclosure.

Referring to FIG. 10, in various embodiments, the side member 920 may include a first connection piece 9211 formed at a first position L1 and a second connection piece 9212 formed at a second position L2 from the non-conductive portion 923. The second position L2 may be closer to the non-conductive portion 923 than the first position L1. In one embodiment, the first connection piece 9211 and the second connection piece 9212 may each be formed as a single body with the side member 920. In one embodiment, the first connection piece 9211 and the second connection piece 9212 may be disposed to overlap with at least a portion of the printed circuit board 970 disposed in a region of the space 9001 formed by the side member 920.

In various embodiments, the electronic device 900 may include the printed circuit board 970 disposed in the internal space 9001 of the side member 920. In one embodiment, the printed circuit board 970 may include a first connection portion 971 (e.g., conductive pad) electrically connected to the first connection piece 9211. In one embodiment, the printed circuit board 970 may include a first electrical path 9701 (e.g., wiring line) ranging from the first connection portion 971 to a first feeder 972 (e.g., wireless communication circuit). In one embodiment, the first feeder 972 may transmit a first signal of a first frequency band at the first position L1 of the first conductive portion 921 electrically connected through the first electrical path 9701. The first frequency band may be in the range of about 900 MHz to 1200 MHz. In one embodiment, a first variable element T1 may be disposed in the middle of the first electrical path 9701. In one embodiment, the first variable element T1 may have a configuration substantially the same as that shown in FIG. 6A. In another embodiment, the first variable element T1 may include a plurality of passive elements for selective switching. In one embodiment, because the printed circuit board 470 is in direct electrical contact with the side member 920 constituting the external appearance of the electronic device 900, an electric shock prevention circuit 973 may be further included in the first electrical path 9701 to prevent electric shock caused by electrostatic discharge (ESD).

In various embodiments, the printed circuit board 970 may include a second connection portion 974 electrically connected to the second connection piece 9212. In one embodiment, the second connection piece 9212 and the printed circuit board 970 may be electrically connected to the second connection portion 974 of the printed circuit board 970 via coupled feeding. This connection configuration (region B) is substantially similar to that of FIG. 7A or 7B, and a description thereof will be omitted. In one embodiment, the printed circuit board 970 may include a second electrical path 9702 (e.g., wiring line) ranging from the second connection portion 974 to a second feeder 975 (e.g., wireless communication circuit). In one embodiment, the second feeder 975 may transmit a second signal of a second frequency band at the second position L2 of the first conductive portion 921 electrically connected through the second electrical path 9702. The second frequency band may be in the range of about 750 MHz to 850 MHz. In one embodiment, a second variable element T2 may be disposed in the middle of the second electrical path 9702. The second variable element T2 may have a configuration substantially the same as that shown in FIG. 6B. In another embodiment, the second variable element T2 may include a plurality of passive elements or tunable ICs for selective switching. In one embodiment, because the printed circuit board 970 is in direct electrical contact with the side member 920 constituting the external appearance of the electronic device 900, an electric shock prevention circuit 976 may be further included in the second electrical path 9702 to prevent electric shock caused by electrostatic discharge (ESD).

In various embodiments, the side member 920 may include a third connection piece 9213 disposed at a third position L3. In one embodiment, the third connection piece 9213 may be formed to extend from the side member 920 toward the space 9001. In one embodiment, the printed circuit board 970 may include a third connection portion 977 (e.g., conductive pad) electrically connected to the third connection piece 9213. In one embodiment, the printed circuit board 970 may include a third electrical path 9703 (e.g., wiring line) ranging from the third connection portion 977 to the ground layer G of the printed circuit board 970. In one embodiment, the printed circuit board 970 may include an electric shock prevention capacitor 978 in the middle of the third electrical path 9703.

In various embodiments, the antenna (e.g., antenna C in FIG. 9A) may be shifted in various ranges of the low band through selective feeding of the first feeder 972 and/or the second feeder 975 with the first conductive portion 921 of the side member 920 and through impedance matching using the first variable element T1 and/or the second variable element T2. For example, feeding through the second feeder 975 coupled with the first conductive portion 921 enables the antenna to perform shifting in a wider frequency range of the low band with a reduction in radiation performance degradation. In one embodiment, to monitor the surrounding environment and to operate the antenna in the frequency band corresponding to the monitored environment, the electronic device 900 may include at least one processor 980 to control the first variable element T1 and/or the second variable element T2.

Figure 11:
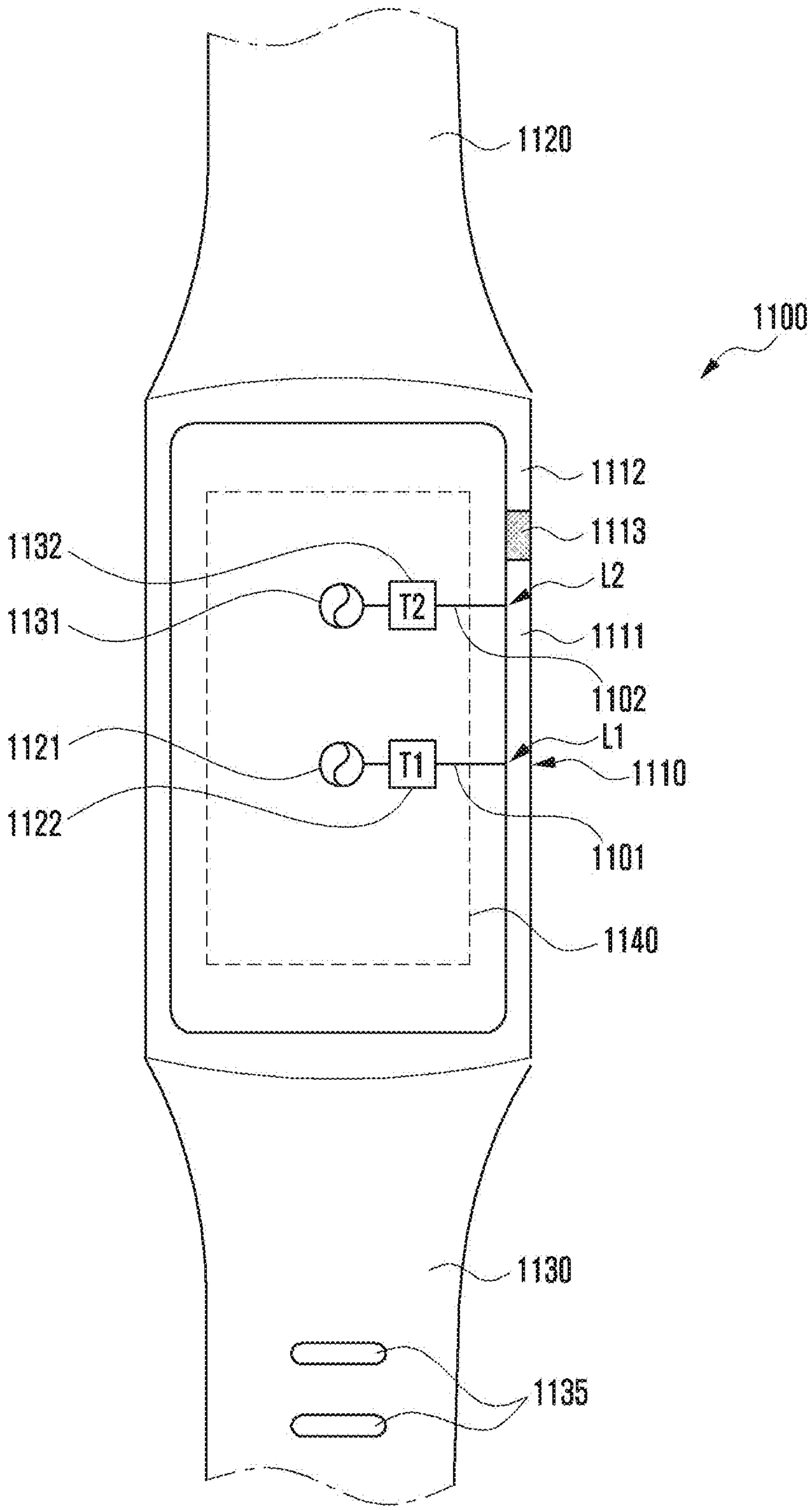
FIG. 11 illustrates a case where the antenna is applied to a wearable electronic device according to an embodiment of the disclosure.

FIG. 11 illustrates a case where the antenna is applied to a wearable electronic device 1100 according to an embodiment of the disclosure.

Referring to FIG. 11, the electronic device 1100 may include a housing 1110 (e.g., metal bezel), a first fastening member 1120 fastened to one side of the housing 1110, and a second fastening member 1130 fastened to the other side of the housing 1110 and having at least one fastener 1135. In one embodiment, the electronic device 1100 may include a printed circuit board 1140 mounted in the internal space of the housing 1110. In one embodiment, the electronic device 1100 may include at least one feeder 1121 and 1131 (e.g., wireless communication circuit) mounted at a portion of the printed circuit board 1140.

In various embodiments, at least a portion of the housing 1110 may be made of a conductive member (e.g., metal member). In one embodiment, the housing 1110 may include a first conductive portion 1111 formed at a portion of the conductive member region, a second conductive portion 1112, and a non-conductive portion 1113 formed between the first conductive portion 1111 and the second conductive portion 1112. The housing 1110 may be utilized as a conductive side member. The first conductive portion 1111 may be electrically connected to the first feeder 1121 at a first position L1 through a first electrical path 1101, and may be electrically connected to the second feeder 1131 at a second position L2 through a second electrical path 1102. In one embodiment, a first variable element T1 1122 and a second variable element T2 1132 having the same configuration as described above may be disposed in the middle of the first electrical path 1101 and the second electrical path 1102, respectively. In one embodiment, the printed circuit board 1140 and the first conductive portion 1111 may be coupled fed at the second position L2. The first conductive portion 1111 used as an antenna may be selectively fed with the first feeder 1121 and/or the second feeder 1131, and may be shifted in various ranges of the low band through impedance matching using the first variable element T1 and/or the second variable element T2. For example, feeding through the second feeder 1131 coupled with the first conductive portion 1111 enables the antenna to perform shifting in a wider frequency range of the low band with a reduction in radiation performance degradation. In one embodiment, to monitor the surrounding environment and to operate the antenna in the frequency band corresponding to the monitored environment, the electronic device 1100 may include at least one processor (not shown) to control the first variable element T1 and/or the second variable element T2.

In various embodiments, as described above, the antenna of the disclosure where a pair of feeders are provided to one conductive portion and coupled feeding is applied to one of the feeders is applied to, but not limited to, a folder type electronic device (e.g., electronic device 400 in FIG. 4A), a bar type electronic device (e.g., electronic device 900 in FIG. 9A), and a wearable type electronic device (e.g., electronic device 1100 in FIG. 11). For example, the antenna structure of the disclosure can be applied to various electronic devices having a housing, a bezel, a side support structure, or a side member including a conductive portion. Such electronic devices may have different shapes or different operating mechanisms.

In various embodiments of the disclosure, the antenna is implemented through direct feeding and coupled feeding at different locations of the conductive portion including a single non-conductive portion. Hence, it is possible for the antenna to shift to a specified frequency range in the low band without compromising performance over a relatively wide bandwidth.

According to various embodiments of the disclosure, the electronic device (e.g., electronic device 400 in FIG. 4A) may include: a foldable housing including: a hinge structure (e.g., hinge structure 460 in FIG. 4A); a first housing structure (e.g., first housing structure 410 in FIG. 4A) connected to the hinge structure and including a first surface (e.g., first surface 411 in FIG. 4A) facing in a first direction, a second surface (e.g., second surface 412 in FIG. 4A) facing in a second direction opposite to the first direction, and a first side member (e.g., first side member 413 in FIG. 4A) enclosing at least a portion of the space between the first surface and the second surface (e.g., space 4001 in FIG. 5) and including a first conductive portion (e.g., first conductive portion 4131 in FIG. 4A), a first non-conductive portion (e.g., first non-conductive portion 4132 in FIG. 4A), and a second conductive portion (e.g., second conductive portion 4133 in FIG. 4A) arranged in sequence from the hinge structure; and a second housing structure (e.g., second housing structure 420 in FIG. 4A) connected to the hinge structure and foldable with the first housing structure with respect to the hinge structure, and including a third surface (e.g., third surface 421 in FIG. 4A) facing in a third direction, a fourth surface (e.g., fourth surface 422 in FIG. 4A) facing in a fourth direction opposite to the third direction, and a second side member (e.g., second side member 423 in FIG. 4A) enclosing at least a portion of the space between the third surface and the fourth surface and including a third conductive portion (e.g., third conductive portion 4231 in FIG. 4A), a second non-conductive portion (e.g., second non-conductive portion 4232 in FIG. 4A), a fourth conductive portion (e.g., fourth conductive portion 4333 in FIG. 4A), a third non-conductive portion (e.g., third non-conductive portion 4234 in FIG. 4A), and a fifth conductive portion (e.g., fifth conductive portion 4235 in FIG. 4A) arranged in sequence from the hinge structure, wherein the first surface may face the third surface in the folded state and the third direction may be the same as the first direction in the unfolded state; a flexible display (e.g., display 430 in FIG. 4A) extending from the first surface to the third surface; a printed circuit board (e.g., printed circuit board 470 in FIG. 5) disposed between the first surface and the second surface and including at least one ground layer; at least one wireless communication circuit (e.g., first feeder 472 or second feeder 475 in FIG. 5) disposed in the printed circuit board and including a first electrical path (e.g. first electrical path 4701 in FIG. 5) carrying a first signal of a first frequency band and a second electrical path (e.g., second electrical path 4702 in FIG. 5) carrying a second signal of a second frequency band; a first variable element (e.g., first variable element T1 in FIG. 5) including a first terminal (e.g., first terminal C1 in FIG. 6A) electrically connected to the first electrical path, a second terminal (e.g., second terminal C2 in FIG. 6A) electrically connected to the ground layer (e.g., ground layer G in FIG. 5), and a third terminal (e.g., third terminal C3 in FIG. 6A) electrically connected to a first position (e.g., first position L1 in FIG. 5) of the second conductive portion; and a second variable element (e.g., second variable element T2 in FIG. 5) including a fourth terminal (e.g., fourth terminal C4 in FIG. 6B) electrically connected to the second electrical path, a fifth terminal (e.g., fifth terminal C5 in FIG. 6B) electrically connected to the ground layer, and a sixth terminal (e.g., sixth terminal C6 in FIG. 6B) electrically connected to a third electrical path (e.g., third electrical path 4703 in FIG. 7A) connected to a second position (e.g., second position L2 of FIG. 5) of the second conductive portion, the second position being closer to the first non-conductive portion than the first position.

In various embodiments, the first non-conductive portion (e.g., first non-conductive portion 4132 in FIG. 4A) may at least partially overlap the second non-conductive portion (e.g., second non-conductive portion 4232 in FIG. 4A) when viewed from above the first surface in the folded state.

In various embodiments, the first frequency band may include frequencies in the range of about 900 MHz to about 1200 MHz, and the second frequency band may include frequencies in the range of about 750 MHz to about 850 MHz.

In various embodiments, the third electrical path may include at least one conductive pattern (e.g., first conductive pad 4742 in FIG. 7A) coupled with the second position through a dielectric (e.g., non-conductive portion 4707 in FIG. 7A).

In various embodiments, the third electrical path may further include a flexible connection member (e.g., electrical connection member 4743 in FIG. 7A) between the conductive pattern and the second position.

In various embodiments, the first variable element may include a tuner.

In various embodiments, the second variable element may include a switch.

In various embodiments, a third position (e.g., third position L3 in FIG. 5) of the second conductive portion farther than the first position from the first non-conductive portion may be electrically connected to the ground layer of the printed circuit board through a fourth electrical path (e.g., fifth electrical path 4705 in FIG. 5).

According to various embodiments of the disclosure, the electronic device (e.g., electronic device 900 in FIG. 9A) may include: a housing (e.g., housing 910 in FIG. 9A) including a first plate (e.g., first plate 902 in FIG. 9A), a second plate (e.g., second plate 911 in FIG. 9B) facing away from the first plate, and a side member (e.g., side member 920 in FIG. 9A) enclosing the space (e.g., space 9001 in FIG. 10) between the first plate and the second plate and connected to the second plate or formed as a single body with the second plate, wherein the side member may include a first conductive portion (e.g., first conductive portion 921 in FIG. 10), a second conductive portion (e.g., second conductive portion 922 in FIG. 10), and a non-conductive portion (e.g., non-conductive portion 923 in FIG. 10) formed between the first conductive portion and the second conductive portion, wherein the first conductive portion may include a first position (e.g., first position L1 in FIG. 10) and a second position (e.g. second position L2 in FIG. 10) closer to the non-conductive portion than the first position; a printed circuit board (e.g., printed circuit board 970 in FIG. 10) disposed between the first plate and the second plate and including at least one ground layer (e.g., ground layer G in FIG. 10); at least one wireless communication circuit (e.g., first feeder 972 or second feeder 975 in FIG. 10) disposed in the printed circuit board, and including a first electrical path (e.g., first electrical path 9701 in FIG. 10) carrying a first signal of a first frequency band and a second electrical path (e.g., second electrical path 9702 in FIG. 10) carrying a second signal of a second frequency band; a first variable element (e.g., first variable element T1 in FIG. 10) including a first terminal (e.g., first terminal C1 in FIG. 6A) electrically connected to the first electrical path, a second terminal (e.g., second terminal C2 in FIG. 6A) electrically connected to the ground layer, and a third terminal (e.g., third terminal C3 in FIG. 6A) electrically connected to the first position; and a second variable element (e.g., second variable element T2 in FIG. 10) including a fourth terminal (e.g., fourth terminal C4 in FIG. 6B) electrically connected to the second electrical path, a fifth terminal (e.g., fifth terminal C5 in FIG. 6B) electrically connected to the ground layer, and a sixth terminal (e.g., sixth terminal C6 in FIG. 6B) electrically connected to a third electrical path connected to the second position (e.g., second position L2 in FIG. 10).

In various embodiments, the first frequency band may include frequencies in the range of about 900 MHz to about 1200 MHz, and the second frequency band may include frequencies in the range of about 750 MHz to about 850 MHz.

In various embodiments, the third electrical path may include at least one conductive pattern (e.g., first conductive pad 4742 in FIG. 7A) coupled with the second position through a dielectric (e.g., non-conductive portion 4707 in FIG. 7A).

In various embodiments, the third electrical path may further include a flexible connection member (e.g., electrical connection member 4743 in FIG. 7A) between the conductive pattern and the second position.

In various embodiments, the first variable element may include a tuner.

In various embodiments, the second variable element may include a switch.

In various embodiments, a third position (e.g., third position L3 in FIG. 10) of the first conductive portion (e.g., first conductive portion 921 in FIG. 10) farther than the first position from the non-conductive portion may be electrically connected to the ground layer of the printed circuit board through a fourth electrical path (e.g., fourth electrical path 9703 in FIG. 5).

According to various embodiments of the disclosure, the electronic device (e.g., electronic device 900 in FIG. 9A) may include: a housing (e.g., housing 910 in FIG. 9A) including a first plate (e.g., first plate 902 in FIG. 9A), a second plate (e.g., second plate 911 in FIG. 9B) facing away from the first plate, and a side member (e.g., side member 920 in FIG. 9A) enclosing the space (e.g., space 9001 in FIG. 10) between the first plate and the second plate, wherein the side member may include a first conductive portion (e.g., first conductive portion 921 in FIG. 9A), a second conductive portion (e.g., second conductive portion 922 in FIG. 9A), and a non-conductive portion (e.g., non-conductive portion 923 in FIG. 9A) formed between the first conductive portion and the second conductive portion, wherein the first conductive portion may include a first position (e.g., first position L1 in FIG. 9A) and a second position (e.g. second position L2 in FIG. 9A) closer to the non-conductive portion than the first position; a printed circuit board (e.g., printed circuit board 970 in FIG. 10) disposed between the first plate and the second plate and including at least one ground layer (e.g., ground layer G in FIG. 10); at least one wireless communication circuit (e.g., first feeder 972 or second feeder 975 in FIG. 10) disposed in the printed circuit board and including a first electrical path (e.g., first electrical path 9701 in FIG. 10) electrically connected to the first conductive portion at the first position and carrying a first signal of a first frequency band, and a second electrical path (e.g., second electrical path 9702 in FIG. 10) electrically connected to the first conductive portion at the second position and carrying a second signal of a second frequency band; a first variable element (e.g. first variable element T1 in FIG. 10) included in the middle of the first electrical path; a second variable element (e.g. second variable element T2 in FIG. 10) included in the middle of the second electrical path; and at least one processor (e.g., processor 980 in FIG. 10) configured to generate a control signal corresponding to the current mode of the electronic device and apply the control signal to the first variable element and/or the second variable element.

In various embodiments, the first frequency band may include frequencies in the range of about 900 MHz to about 1200 MHz, and the second frequency band may include frequencies in the range of about 750 MHz to about 850 MHz.

In various embodiments, the first variable element and/or the second variable element may include a tunable IC or a switch electrically connected to at least one of plural active elements and/or passive elements.

In various embodiments, the electronic device may further include a third electrical path (e.g., third electrical path 4703 in FIG. 7A) coupled with the second position through a dielectric.

In various embodiments, a third position (e.g., third position L3 in FIG. 10) of the first conductive portion farther than the first position from the non-conductive portion may be electrically connected to the ground layer of the printed circuit board through a fourth electrical path (e.g., fourth electrical path 9703 in FIG. 10).

While the disclosure has been shown and described with reference to various embodiments thereof, it will be understood by those skilled in the art that various changes in form and details may be made therein without departing from the spirit and scope of the disclosure as defined in the appended claims and their equivalents.

What is claimed is:

1. A portable communication device comprising:

a housing including a side member forming a side surface of the portable communication device, the side member including a first conductive portion;

a printed circuit board (PCB) accommodated in the housing, the PCB including a first electrical path to carry a first signal of a first frequency band and a second electrical path to carry a second signal of a second frequency band, the first electrical path electrically connected to a first position of the first conductive portion and a first feeder, and the second electrical path electrically connected to a second position of the first conductive portion and a second feeder, and a third electrical path electrically connected to a third position of the of the first conductive portion and to a ground of the PCB;

a first variable element electrically connected to the first position of the first conductive portion and the first electrical path such that the first position is electrically connected to the ground of the PCB via the first variable element; and a second variable element electrically connected to the second position of the first conductive portion and the second electrical path such that the second position is electrically connected to the ground of the PCB via the second variable element, wherein the third position is disposed farther from the second position than the first position, and wherein the first position is disposed between the second position and the third position.

2. The portable communication device of claim 1, at least one of the first variable element and the second variable element includes a plurality of passive elements for selective switching.

3. The portable communication device of claim 1, wherein each of the first variable element and the second variable element in formed in the PCB.

4. The portable communication device of claim 1, wherein the first variable element is disposed in the middle of the first electrical path.

5. The portable communication device of claim 4, wherein the first variable element includes a plurality of passive elements for selective switching.

6. The portable communication device of claim 1, wherein the second variable element is disposed in the middle of the second electrical path.

7. The portable communication device of claim 6, wherein the second variable element includes a plurality of passive elements or tunable ICs for selective switching.

8. The portable communication device of claim 1, wherein the first frequency band includes frequencies in a range of about 900 MHz to about 1200 MHz, and wherein the second frequency band includes frequencies in a range of about 750 MHz to about 850 MHz.

9. The portable communication device of claim 1, wherein the first variable element is serially connected with respect to the first position and the first electrical path.

10. The portable communication device of claim 1, wherein the second variable element is serially connected with respect to the second position and the second electrical path.

11. The portable communication device of claim 1, wherein an electric first shock prevention circuit is included in the first electrical path, and wherein a second electric shock prevention circuit is included in the second electrical path.

12. The portable communication device of claim 1, wherein the first feeder is tuned through the first variable element, and wherein the second feeder is tuned through the second variable element.

* * * * *